(12) United States Patent
Tanaka et al.

(10) Patent No.: US 8,278,699 B2
(45) Date of Patent: Oct. 2, 2012

(54) NONVOLATILE SEMICONDUCTOR MEMORY DEVICE

(75) Inventors: Hiroyasu Tanaka, Mie-ken (JP); Ryota Katsumata, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/886,010

(22) Filed: Sep. 20, 2010

(65) Prior Publication Data

US 2011/0316069 A1 Dec. 29, 2011

(30) Foreign Application Priority Data

Jun. 25, 2010 (JP) ................................. 2010-145454

(51) Int. Cl.
*H01L 29/792* (2006.01)
(52) U.S. Cl. ................................. 257/324; 257/E29.309
(58) Field of Classification Search .................. 257/324, 257/E29.309
See application file for complete search history.

(56) References Cited

U.S. PATENT DOCUMENTS

| | | | |
|---|---|---|---|
| 6,727,544 B2 | 4/2004 | Endoh et al. | |
| 6,870,215 B2 | 3/2005 | Endoh et al. | |
| 6,888,770 B2 * | 5/2005 | Ikehashi | 365/205 |
| 2005/0047240 A1 * | 3/2005 | Ikehashi et al. | 365/222 |
| 2007/0252201 A1 | 11/2007 | Kito et al. | |
| 2010/0207195 A1 | 8/2010 | Fukuzumi et al. | |

FOREIGN PATENT DOCUMENTS

JP 2009-146954 7/2009

OTHER PUBLICATIONS

U.S. Appl. No. 12/839,895, filed Jul. 20, 2010, Yoshiaki Fukuzumi, et al.
U.S. Appl. No. 12/717,499, filed Mar. 4, 2010, Ryota Katsumata, et al.

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory unit and a non-memory unit. The memory unit includes a stacked structure including electrode films stacked in a first direction, and a interelectrode insulating film provided between the electrode films, a select gate electrode stacked with the stacked structure along the first direction, a semiconductor pillar piercing the stacked structure and the select gate electrode along the first direction and a pillar portion memory layer provided between the electrode films and the semiconductor pillar. The non-memory unit includes a dummy conductive film including a portion in a layer being identical to at least one of the electrode films, a dummy select gate electrode in a layer being identical to the select gate electrode, a first non-memory unit contact electrode electrically connected to the dummy conductive and a second non-memory unit contact electrode electrically connected to the dummy select gate.

20 Claims, 30 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-145454, filed on Jun. 25, 2010; the entire contents of which are incorporated herein by reference.

FIELD

Embodiments described herein relate generally to a nonvolatile semiconductor memory device.

BACKGROUND

In conventional nonvolatile semiconductor memory devices, device elements are integrated in a two-dimensional plane on a silicon substrate. Increasing its memory capacity requires miniaturization of the dimensions of each single element. However, such miniaturization has recently been difficult in terms of cost and technology.

In this context, a collectively processed three-dimensional stacked memory has been proposed. This collectively processed three-dimensional stacked memory includes a stacked structure with insulating films and electrode films alternately stacked therein, silicon pillars piercing the stacked structure, and a charge storage layer (memory layer) provided between the silicon pillar and the electrode film. Thus, a memory cell is formed at the intersection between the silicon pillar and each electrode film. Furthermore, it is also proposed to use a U-shaped memory string connecting two silicon pillars on the substrate side.

In such a collectively processed three-dimensional stacked memory, when memory cells are formed, a conductive film is formed in the peripheral circuit region around the memory cells. However, instability of the potential of this conductive film may result in unstable operation of the memory.

DETAILED DESCRIPTION

Figure 1:
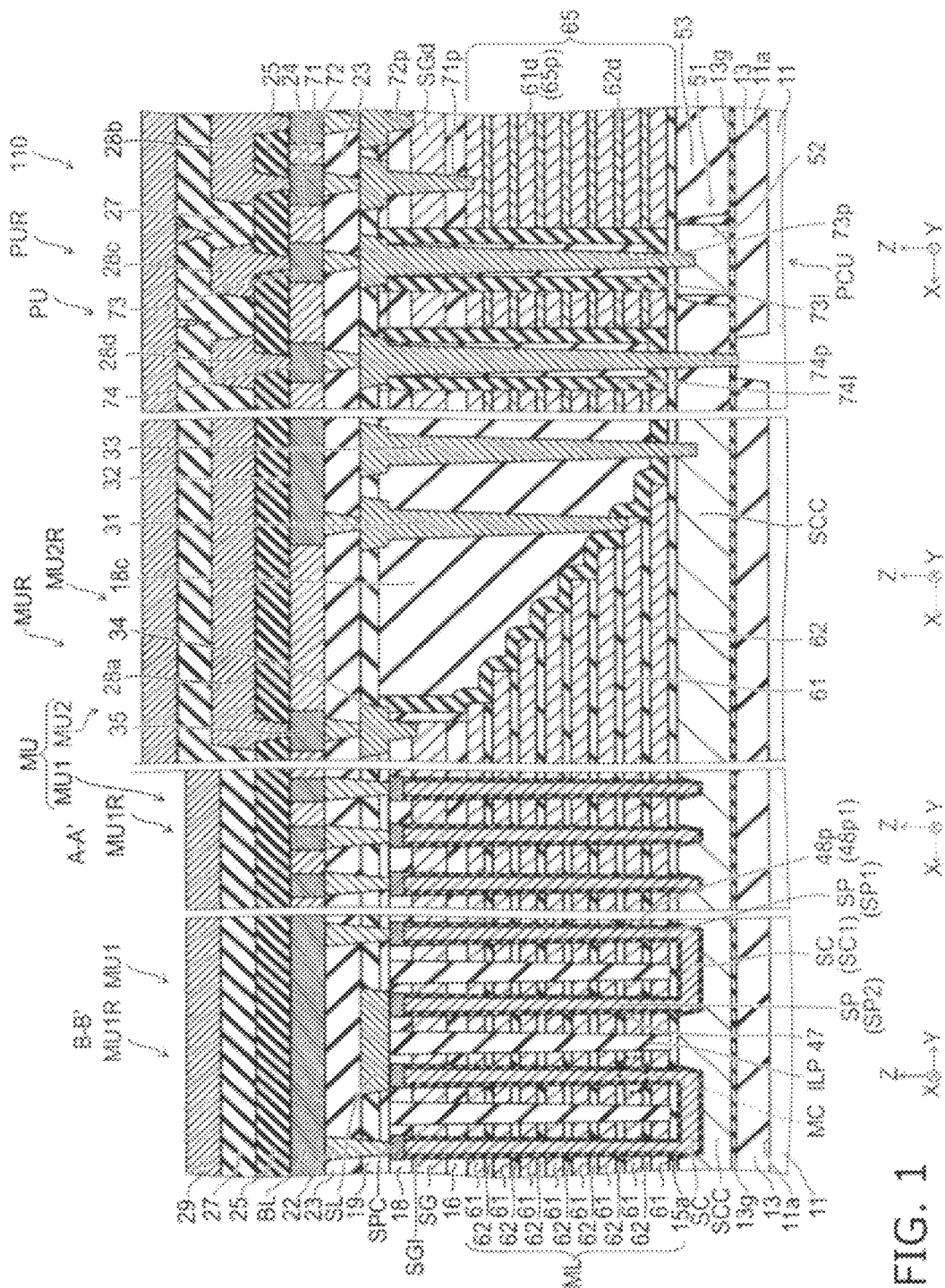
FIG. 1 is a schematic cross-sectional view illustrating the configuration of a nonvolatile semiconductor memory device according to a first embodiment.

In general, according to one embodiment, a nonvolatile semiconductor memory device includes a memory unit configured to store information and a non-memory unit juxtaposed with the memory unit and not configured to store information. The memory unit includes a first stacked structure including a plurality of first electrode films stacked in a first direction, and a first interelectrode insulating film provided between the plurality of first electrode films, a first select gate electrode stacked with the first stacked structure along the first direction, a first semiconductor pillar piercing the first stacked structure and the first select gate electrode along the first direction and a first pillar portion memory layer provided between the plurality of first electrode films and the first semiconductor pillar. The non-memory unit includes a dummy conductive film including a portion in a layer being identical to at least one of the plurality of first electrode films, a dummy select gate electrode in a layer being identical to the select gate electrode, a first non-memory unit contact electrode electrically connected to the dummy conductive film and extending along the first direction and a second non-memory unit contact electrode electrically connected to the dummy select gate electrode and extending along the first direction.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, the same components as those described previously with reference to earlier figures are labeled with like reference numerals, and the detailed description thereof is omitted as appropriate.

First Embodiment

FIG. 1 is a schematic cross-sectional view illustrating the configuration of a nonvolatile semiconductor memory device according to a first embodiment.

Figure 2:
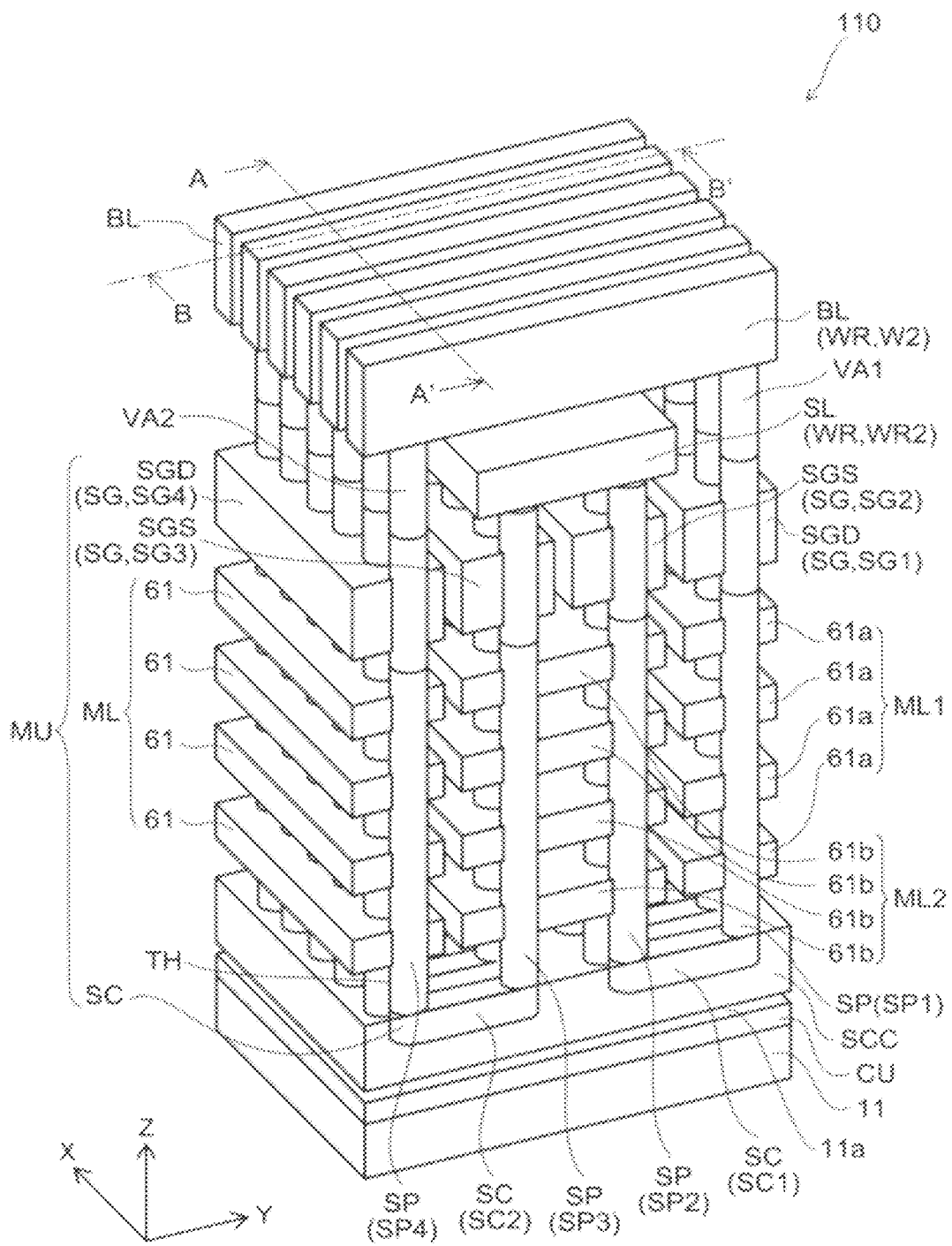
FIG. 2 is a schematic perspective view illustrating the configuration of the nonvolatile semiconductor memory device according to the first embodiment.

FIG. 2 is a schematic perspective view illustrating the configuration of the nonvolatile semiconductor memory device according to the first embodiment.

In FIG. 2, for clarity of illustration, only the conductive portions are shown, and illustration of the insulating portions is omitted.

Figure 3:
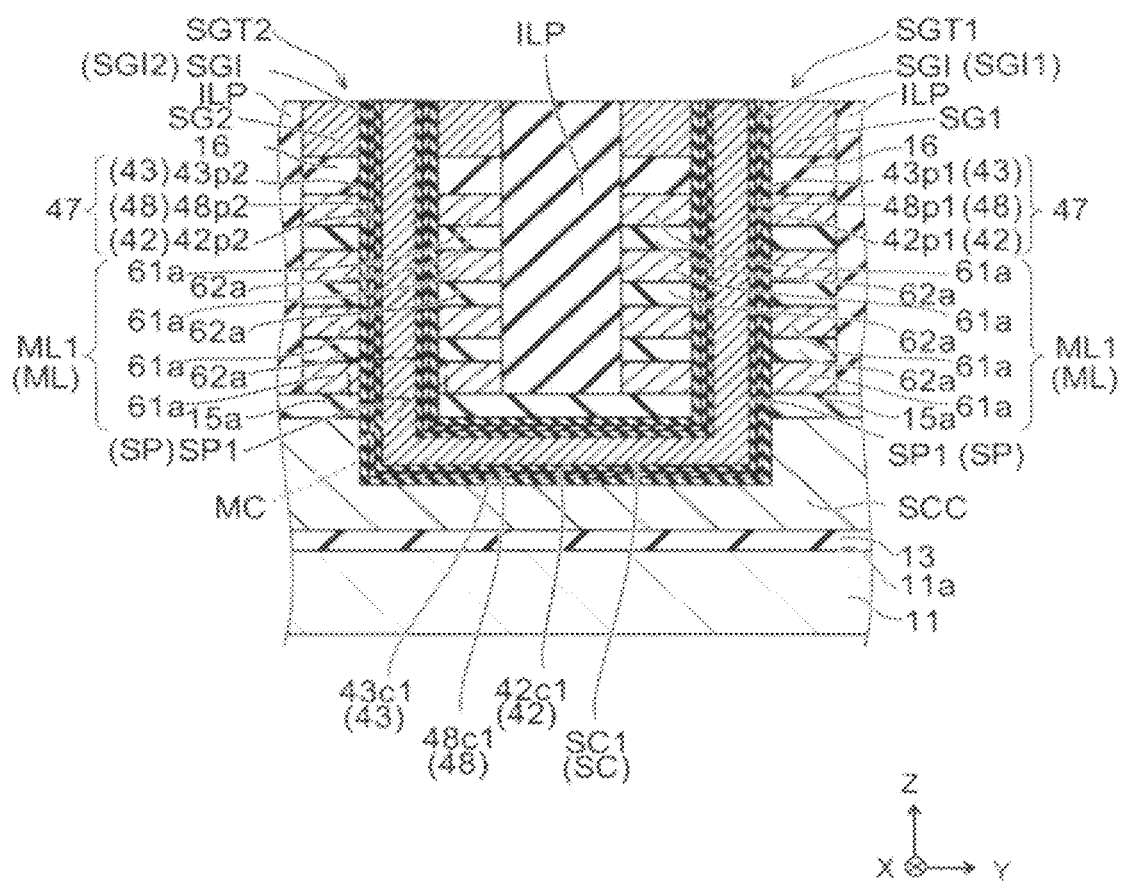
FIG. 3 is a schematic cross-sectional view illustrating the configuration of part of the nonvolatile semiconductor memory device according to the first embodiment.

FIG. 3 is a schematic cross-sectional view illustrating the configuration of part of the nonvolatile semiconductor memory device according to the first embodiment.

As shown in FIG. 1, the nonvolatile semiconductor memory device 110 according to this embodiment includes a memory unit MU configured to store information and a non-memory unit PU not configured to store information.

The memory unit MU includes a stacked structure ML. The stacked structure ML includes a plurality of electrode films and a plurality of interelectrode insulating films 62 alternately stacked in a first direction.

The term "stacked" used herein refers not only to the case where a plurality of layers are directly stacked, but also to the case where a plurality of layers are stacked with other components interposed therebetween.

The stacking direction of the electrode films 61 and the interelectrode insulating films 62 in the stacked structure ML is defined as Z-axis direction (first direction). One of the directions perpendicular to the Z-axis direction is defined as Y-axis direction (second direction). Furthermore, the direction perpendicular to the Z-axis direction and the Y-axis direction is defined as X-axis direction (third direction).

The nonvolatile semiconductor memory device 110 can further include a substrate 11 with the memory unit MU and the non-memory unit PU provided thereon. The substrate 11 is e.g. a silicon substrate.

The Z-axis direction is perpendicular to the major surface 11a of the substrate 11. The memory unit MU and the non-memory unit PU are provided on the major surface 11a of the substrate 11.

More specifically, the non-memory unit PU is juxtaposed with the memory unit MU in a direction orthogonal to the Z-axis direction. The non-memory unit PU is juxtaposed with the memory unit MU in the X-Y plane, for instance. The non-memory unit PU is juxtaposed with the memory unit MU in the X-axis direction, for instance. Alternatively, the non-memory unit PU is juxtaposed with the memory unit MU in the Y-axis direction, for instance. A plurality of non-memory units PU may be juxtaposed with one memory unit MU.

The memory unit MU includes memory cells MC of the nonvolatile semiconductor memory device 110. The non-memory unit PU is provided e.g. around the memory unit MU, and can include a peripheral circuit of the nonvolatile semiconductor memory device 110.

On the substrate 11, the region provided with the memory unit MU is referred to as a memory region MUR, and the region provided with the non-memory unit PU is referred to as a non-memory region PUR.

The memory unit MU illustratively includes a matrix memory cell unit MU1 including memory cell transistors arranged in a three-dimensional matrix, and an interconnection connecting unit MU2 for connecting interconnections of the matrix memory cell unit MU1. On the substrate 11, the region provided with the matrix memory cell unit MU1 is referred to as a matrix memory cell region MU1R, and the region provided with the interconnection connecting unit MU2 is referred to as an interconnection connecting region MU2R.

FIG. 2 illustrates the configuration of the matrix memory cell unit MU1.

With regard to the matrix memory cell unit MU1, FIG. 1 illustrates part of its A-A' cross section in FIG. 2 and part of its B-B' cross section in FIG. 2.

As shown in FIGS. 1 and 2, in the matrix memory cell unit MU1, a stacked structure ML is provided on the major surface 11a of the substrate 11.

The nonvolatile semiconductor memory device 110 further includes a select gate electrode SG. The select gate electrode SG is stacked with the stacked structure ML along the Z-axis direction.

In this example, the electrode film 61 includes a strip-shaped portion extending along the X-axis direction. The select gate electrode SG also includes a strip-shaped portion extending along the X-axis direction.

Furthermore, a semiconductor pillar SP is provided so as to pierce the stacked structure ML and the select gate electrode SG along the Z-axis direction. This semiconductor pillar SP is formed by e.g. burying a semiconductor in a through hole TH piercing the stacked structure ML and the select gate electrode SG along the Z-axis direction. The semiconductor pillar SP is shaped like a cylinder (e.g., circular cylinder) or a column (e.g., circular column) extending in the Z-axis direction. That is, the inside of the semiconductor pillar SP may be hollow, or may be provided with e.g. an insulator.

As described later, in the memory unit MU of the nonvolatile semiconductor memory device 110, a memory cell transistor including a memory layer is formed at the intersection between the electrode film 61 and the semiconductor pillar SP. The memory cell transistors are arranged in a three-dimensional matrix. Each memory cell transistor functions as a memory cell MC for storing information (data) by storing charge in this memory layer.

That is, the memory unit MU further includes a pillar portion memory layer 48p provided between the plurality of electrode films 61 and the semiconductor pillar SP.

On the other hand, the non-memory unit PU includes a dummy conductive film 65, a dummy select gate electrode SGd, a first non-memory unit contact electrode 71p, and a second non-memory unit contact electrode 72p.

The dummy conductive film 65 includes a portion 65p in the same layer as at least one of the plurality of electrode films 61 (first electrode films 61a). That is, the aforementioned portion 65p of the dummy conductive film 65 is located along the surface perpendicular to the Z-axis direction of at least one of the plurality of electrode films 61. For instance, the distance along the Z-axis direction between the aforementioned portion 65p of the dummy conductive film 65 and the substrate 11 is equal to the distance along the Z-axis direction between the at least one of the plurality of electrode films 61 and the substrate 11.

The dummy select gate electrode SGd is in the same layer as the select gate electrode SG (first select gate electrode SG1). That is, the surface perpendicular to the Z-axis direction of the dummy select gate electrode SGd is located in a plane including the surface perpendicular to the Z-axis direction of the select gate electrode SG. For instance, the distance along the Z-axis direction between the dummy select gate electrode SGd and the substrate 11 is equal to the distance along the Z-axis direction between the select gate electrode SG and the substrate 11.

The first non-memory unit contact electrode 71p is electrically connected to the dummy conductive film 65 and extends along the Z-axis direction. The second non-memory unit contact electrode 72p is electrically connected to the dummy select gate electrode SGd and extends along the Z-axis direction.

For instance, the dummy conductive film 65 can include a plurality of first dummy films 61d respectively in the same layer as the plurality of electrode films 61, and a plurality of second dummy films 62d respectively in the same layer as the plurality of interelectrode insulating films 62.

The first dummy film 61d is located at the same height as the electrode film 61 as viewed from the substrate 11. The first dummy film 61d can be made of the same material as the electrode film 61, for instance.

The second dummy film 62d is located at the same height as the interelectrode insulating film 62 as viewed from the substrate 11. The second dummy film 62d can be made of the same material as the interelectrode insulating film 62, for instance. Alternatively, the second dummy film 62d is made of a material different from the material used for the interelectrode insulating film 62.

In this example, the second dummy film 62d is a conductive film. Hence, this is an example in which the second dummy film 62d is made of a material different from the material used for the interelectrode insulating film 62.

In the case where the first dummy film 61d is a conductive film and the second dummy film 62d is an insulating film, the boundary between the first dummy film 61d and the second dummy film 62d is relatively clear. On the other hand, in the case where both the first dummy film 61d and the second dummy film 62d are conductive films, the boundary between the first dummy film 61d and the second dummy film 62d may be unclear. Thus, as the case may be, the first dummy film 61d and the second dummy film 62d can be distinguished relatively clearly, or cannot be clearly distinguished.

For instance, the first dummy film 61d is the aforementioned portion 65p of the dummy conductive film 65 in the same layer as at least one of the plurality of electrode films 61.

The width along the Z-axis direction of the dummy conductive film 65 can be made substantially the same as the width along the Z-axis direction of the stacked structure ML (e.g., first stacked structure ML1).

As described later, for instance, when the electrode film 61 of the memory unit MU is formed, the dummy conductive film 65 of the non-memory unit PU is formed simultaneously with the electrode film 61. Furthermore, for instance, when the select gate electrode SG of the memory unit MU is formed, the dummy select gate electrode SGd of the non-memory unit PU is formed simultaneously with the select gate electrode SG.

The first non-memory unit contact electrode 71p is connected to an interconnection 71. The second non-memory unit contact electrode 72p is connected to an interconnection 72. Thus, the dummy conductive film 65 is placed at a prescribed potential through the first non-memory unit contact electrode 71p and the interconnection 71. Furthermore, the dummy select gate electrode SGd is placed at a prescribed potential through the second non-memory unit contact electrode 72p and the interconnection 72.

Thus, electrical interference between the conductive layers in the nonvolatile semiconductor memory device 110 is suppressed, and more stable operation can be achieved.

In the following, an example configuration of the memory unit MU is described in detail.

As illustrated in FIG. 1, in the nonvolatile semiconductor memory device 110, an interlayer insulating film 13 is provided on the major surface 11a of the substrate 11. An insulating film 13g is provided on the interlayer insulating film 13. The insulating film 13g functions as a gate insulating film of a peripheral circuit transistor 51 described later. Furthermore, a connecting portion conductive layer SCC described later is provided on the insulating film 13g. A stacked structure ML is provided on the connecting portion conductive layer SCC.

In FIG. 1, eight electrode films 61 are depicted. However, the number of electrode films 61 provided in the stacked structure ML is arbitrary. In FIG. 2, for clarity of illustration, the electrode films 61 are partly omitted.

In the semiconductor pillar SP, the portion piercing the stacked structure ML may be a semiconductor layer formed continuously with the portion piercing the select gate electrode SG. Alternatively, the portion of the semiconductor pillar SP piercing the stacked structure ML and the portion of the semiconductor pillar SP piercing the select gate electrode SG may be formed in different process steps and then electrically connected.

As shown in FIG. 1, an insulating film 15a can be provided below the lowermost electrode film 61 (e.g., the electrode film 61 nearest to the substrate 11) of the stacked structure ML. This insulating film 15a can also be included in the stacked structure ML. Furthermore, another insulating film can be provided above the uppermost electrode film 61 (e.g., the electrode film 61 farthest from the substrate 11) of the stacked structure ML. This insulating film can also be included in the stacked structure ML. These insulating films can be made of e.g. silicon oxide. However, the embodiment is not limited thereto, but the material of these insulating films is arbitrary.

An interlayer insulating film 16 is provided between the stacked structure ML and the select gate electrode SG. Furthermore, an interlayer insulating film ILP dividing the electrode films 61 from each other along the Y-axis direction is provided. The interlayer insulating film ILP extends along the X-axis direction. In this example, this interlayer insulating film ILP further divides the select gate electrodes SG from each other along the Y-axis direction.

An interlayer insulating film 18 is provided on the select gate electrode SG and the interlayer insulating film ILP. A source line SL (second interconnection WR2) and a contact electrode 22 are provided on the interlayer insulating film 18. An interlayer insulating film 19 is provided around the source line SL. In this example, the source line SL is shaped like a strip along the X-axis direction.

An interlayer insulating film 23 is provided on the source line SL. A bit line BL (first interconnection WR1) is provided on the interlayer insulating film 23. The bit line BL is shaped like e.g. a strip along the Y-axis direction.

An interlayer insulating film 25, an interlayer insulating film 27, and a passivation film 29 are provided on the bit line BL.

The interlayer insulating films 13, 16, 17, 18, 19, 23, 25, and 27 can be made of e.g. silicon oxide. The insulating film 13g is also made of silicon oxide. The passivation film 29 is made of e.g. silicon nitride.

In this example, every two semiconductor pillars SP are connected on the substrate 11 side.

More specifically, the nonvolatile semiconductor memory device 110 further includes a semiconductor connecting portion SC electrically connecting a first semiconductor pillar SP1 and a second semiconductor pillar SP2 on the substrate 11 side. The semiconductor connecting portion SC can be made of the material constituting the semiconductor pillar SP.

However, as described later, the semiconductor pillars SP may be mutually independent without being connected to each other. In the following description, it is assumed that every two semiconductor pillars SP are connected.

Thus, the nonvolatile semiconductor memory device 110 includes a plurality of semiconductor pillars. When all or any of the semiconductor pillars are referred to, the term "semiconductor pillar SP" is used. On the other hand, when a particular semiconductor pillar is referred to in describing the relationship between particular semiconductor pillars, for instance, the term "n-th semiconductor pillar SPn" (n is any integer of one or more) is used. This also applies to other components. For instance, when all or any of the semiconductor connecting portions are referred to, the term "semiconductor connecting portion SC" is used. On the other hand, when a particular semiconductor connecting portion is referred to, the term "n-th semiconductor connecting portion SCn" (n is any integer of one or more) is used.

As shown in FIG. 2, the first semiconductor pillar SP1 and the second semiconductor pillar SP2 connected by the first semiconductor connecting portion SC1 are paired into one U-shaped NAND string. The third semiconductor pillar SP3 and the fourth semiconductor pillar SP4 connected by the second semiconductor connecting portion SC2 are paired into another U-shaped NAND string.

As illustrated in FIG. 1, in the interconnection connecting unit MU2, at one end in the X-axis direction, the electrode film 61 is connected to a word interconnection 32 by a memory unit contact electrode 31, and electrically connected to e.g. a driving circuit provided on the substrate 11. The length in the X-axis direction of the electrode films 61 stacked in the Z-axis direction is varied in a staircase pattern. Thus, the electrode film 61 is electrically connected to a driving circuit at one end in the X-axis direction. Thus, in the electrode films 61 equidistant from the substrate 11, the first semiconductor pillar SP1 and the second semiconductor pillar SP2 constituting a pair can be placed at different potentials. Thus, the memory cells MC in the same layer corresponding to the first semiconductor pillar SP1 and the second semiconductor pillar SP2 can be operated independently of each other. This also applies to the third semiconductor pillar SP3 and the fourth semiconductor pillar SP4.

The connecting portion conductive layer SCC is connected to an interconnection for the connecting portion conductive layer by a memory unit contact electrode 33, for instance.

The select gate electrode SG is connected to an interconnection 35 for the select gate electrode by a memory unit contact interconnection 34, for instance. The interlayer insulating film 25 is provided on the interconnection 35. A metal interconnection 28a connected to the interconnection 35 is provided on the interlayer insulating film 25.

The side surface of the memory unit contact electrode 31 and the memory unit contact interconnection 34 is covered with an interlayer insulating film 18c.

As shown in FIGS. 1 and 2, each end of the semiconductor pillar SP opposite to the semiconductor connecting portion SC is connected to the bit line BL or the source line SL. Each semiconductor pillar SP is provided with a select gate electrode SG (first to fourth select gate electrode SG1-SG4). Thus, desired data can be written to and read from an arbitrary memory cell MC of an arbitrary semiconductor pillar SP.

The number of semiconductor pillars SP provided for each electrode film 61 is arbitrary.

FIG. 3 illustrates the configuration of the matrix memory cell unit MU1. For instance, FIG. 3 is a cross-sectional view corresponding to part of the B-B' cross section in FIG. 1.

As shown in FIG. 3, in the nonvolatile semiconductor memory device 110, the memory unit MU includes a first stacked structure ML1, a first select gate electrode SG1, a first semiconductor pillar SP1, and a first pillar portion memory layer 48p1.

The first stacked structure ML1 includes a plurality of first electrode films 61a stacked in the Z-axis direction, and a first interelectrode insulating film 62a provided between the plurality of first electrode films 61a. The first select gate electrode SG1 is stacked with the first stacked structure ML1 along the Z-axis direction. The first semiconductor pillar SP1 pierces the first stacked structure ML1 and the first select gate electrode SG1 along the Z-axis direction. The first pillar portion memory layer 48p1 is provided between the plurality of first electrode films 61a and the first semiconductor pillar SP1.

The memory unit MU further includes a first pillar portion outer insulating film 43p1 and a first pillar portion inner insulating film 42p1. The first pillar portion outer insulating film 43p1 is provided between the first pillar portion memory layer 48p1 and the plurality of first electrode films 61a. The first pillar portion inner insulating film 42p1 is provided between the first pillar portion memory layer 48p1 and the first semiconductor pillar SP1.

The memory unit MU further includes a second stacked structure ML2, a second select gate electrode SG2, a second semiconductor pillar SP2, a second pillar portion memory layer 48p2, and a semiconductor connecting portion SC (first semiconductor connecting portion SC1).

The second stacked structure ML2 is adjacent to the first stacked structure ML1 in the Y-axis direction perpendicular to the Z-axis direction. The second stacked structure ML2 includes a plurality of second electrode films 61b stacked in the Z-axis direction, and a second interelectrode insulating film 62b provided between the plurality of second electrode films 61b. The second select gate electrode SG2 is stacked with the second stacked structure ML2 along the Z-axis direction. The second semiconductor pillar SP2 pierces the second stacked structure ML2 and the second select gate electrode SG2 along the Z-axis direction. The second pillar portion memory layer 48p2 is provided between the plurality of second electrode films 61b and the second semiconductor pillar SP2.

The semiconductor connecting portion SC connects one end of the first semiconductor pillar SP1 and one end of the second semiconductor pillar SP2.

The memory unit MU further includes a second pillar portion outer insulating film 43p2 and a second pillar portion inner insulating film 42p2. The second pillar portion outer insulating film 43p2 is provided between the second pillar portion memory layer 48p2 and the plurality of second electrode films 61b. The second pillar portion inner insulating film 42p2 is provided between the second pillar portion memory layer 48p2 and the second semiconductor pillar SP2.

The memory unit MU further includes a connecting portion conductive layer SCC opposed to the semiconductor connecting portion SC (first semiconductor connecting portion SC1).

The memory unit MU can further include a first connecting portion memory layer 48c1, a first connecting portion outer insulating film 43c1, and a first connecting portion inner insulating film 42c1. The first connecting portion memory layer 48c1 is provided between the connecting portion conductive layer SCC and the semiconductor connecting portion SC (first semiconductor connecting portion SC1). The first connecting portion outer insulating film 43c1 is provided between the first connecting portion memory layer 48c1 and the connecting portion conductive layer SCC. The first connecting portion inner insulating film 42c1 is provided between the first connecting portion memory layer 48c1 and the first semiconductor connecting portion SC1.

The stacked film of the first pillar portion outer insulating film 43p1, the first pillar portion memory layer 48p1, and the first pillar portion inner insulating film 42p1 is herein referred to as stacked insulating film 47. The stacked insulating film 47 is also the stacked film of the second pillar portion outer insulating film 43p2, the second pillar portion memory layer 48p2, and the second pillar portion inner insulating film 42p2. Furthermore, the stacked insulating film 47 is also the stacked film of the first connecting portion outer insulating film 43c1, the first connecting portion memory layer 48c1, and the first connecting portion inner insulating film 42c1.

The plurality of first electrode films 61a are respectively in the same layer as the plurality of second electrode films 61b. That is, the distance between the substrate 11 and each of the plurality of first electrode films 61a is equal to the distance between the substrate 11 and a corresponding one of the plurality of second electrode films 61b. Furthermore, the distance between the substrate 11 and each of a plurality of first interelectrode insulating films 62a is equal to the distance between the substrate 11 and a corresponding one of a plurality of second interelectrode insulating film 62b.

A memory cell transistor is formed at the intersection between the electrode film 61 (first electrode film 61a and second electrode film 61b) and the semiconductor pillar SP (first semiconductor pillar SP1 and second semiconductor pillar SP2). Each of such memory cell transistors constitutes a memory cell MC.

The electrode film 61 is applied with a prescribed electrical signal to function as a word electrode of the nonvolatile semiconductor memory device 110.

In each memory cell MC, the memory layer 48 (first pillar portion memory layer 48p1 and second pillar portion memory layer 48p2) stores or releases charge by the electric field applied between the semiconductor pillar SP and the electrode film 61 to function as a portion for storing information. That is, the memory layer 48 (first pillar portion memory layer 48p1 and second pillar portion memory layer 48p2) functions as a charge storage layer.

The inner insulating film 42 (first pillar portion inner insulating film 42p1 and second pillar portion inner insulating film 42p2) functions as a tunnel insulating film in each memory cell MC.

The outer insulating film 43 (first pillar portion outer insulating film 43p1 and second pillar portion outer insulating film 43p2) functions as a block insulating film in each memory cell MC.

The connecting portion memory layer 48c (first connecting portion memory layer 48c1) can be made of the same material as the first pillar portion memory layer 48p1 and the second pillar portion memory layer 48p2. The connecting portion memory layer 48c (first connecting portion memory layer 48c1) can be formed simultaneously with the first pillar portion memory layer 48p1 and the second pillar portion memory layer 48p2.

The first connecting portion inner insulating film 42c1 can be made of the same material as the first pillar portion inner insulating film 42p1 and the second pillar portion inner insulating film 42p2. The first connecting portion inner insulating film 42c1 can be formed simultaneously with the first pillar portion inner insulating film 42p1 and the second pillar portion inner insulating film 42p2.

The first connecting portion outer insulating film 43c1 can be made of the same material as the first pillar portion outer insulating film 43p1 and the second pillar portion outer insulating film 43p2. The first connecting portion outer insulating film 43c1 can be formed simultaneously with the first pillar portion outer insulating film 43p1 and the second pillar portion outer insulating film 43p2.

The voltage applied to the connecting portion conductive layer SCC allows the first semiconductor pillar SP1 and the second semiconductor pillar SP2 to be electrically connected by the semiconductor connecting portion SC (first semiconductor connecting portion SC1).

The portion where the connecting portion conductive layer SCC and the first semiconductor connecting portion SC1 are opposed to each other may be used as a memory cell MC including the first connecting portion memory layer 48c1 as a charge storage layer. That is, the connecting portion memory layer 48c (first connecting portion memory layer 48c1) can store or release charge by the electric field applied between the semiconductor connecting portion SC and the connecting portion conductive layer SCC to function as a portion for storing information.

The electrode film 61 (first electrode film 61a and second electrode film 61b) and the connecting portion conductive layer SCC can be made of any conductive material, such as amorphous silicon (noncrystalline silicon) endowed with conductivity by impurity doping, or polysilicon (polycrystalline silicon) endowed with conductivity by impurity doping, or metals and alloys.

The interelectrode insulating film 62 (first interelectrode insulating film 62a and second interelectrode insulating film 62b), the inner insulating film 42 (first pillar portion inner insulating film 42p1, second pillar portion inner insulating film 42p2, and first connecting portion inner insulating film 42c1), and the outer insulating film 43 (first pillar portion outer insulating film 43p1, second pillar portion outer insulating film 43p2, and first connecting portion outer insulating film 43c1) can be made of e.g. silicon oxide. These films may be either single layer films or stacked films.

The memory layer 48 (first pillar portion memory layer 48p1, second pillar portion memory layer 48p2, and first connecting portion memory layer 48c1) can be made of e.g. silicon nitride. The memory layer 48 may be either a single layer film or a stacked film.

The interelectrode insulating film 62, the inner insulating film 42, the outer insulating film 43, and the memory layer 48 are not limited to the materials illustrated above, but can be made of various materials.

The select gate electrode SG (first select gate electrode SG1 and second select gate electrode SG2) can be made of any conductive material, such as amorphous silicon (noncrystalline silicon) endowed with conductivity by impurity doping, or polysilicon (polycrystalline silicon) endowed with conductivity by impurity doping, or metals and alloys.

A select gate insulating film SGI is provided between the select gate electrode SG and the semiconductor pillar SP.

The select gate insulating film SGI (first select gate insulating film SGI1 and second select gate insulating film SGI2) may be the stacked film of the inner insulating film 42, the memory layer 48, and the outer insulating film 43. Alternatively, the select gate insulating film SGI may be an insulating film different from the stacked film of the inner insulating film 42, the memory layer 48, and the outer insulating film 43. The select gate insulating film SGI may be either a single layer film or a stacked film.

The nonvolatile semiconductor memory device 110 can further include a first interconnection WR1 (bit line BL) and a second interconnection WR2 (source line SL).

The bit line BL is electrically connected to the other end of the first semiconductor pillar SP1 (the end on the opposite side from the semiconductor connecting portion SC, i.e., the first semiconductor connecting portion SC1).

In this example, the bit line BL is electrically connected to the other end of the first semiconductor pillar SP1 through a contact electrode 22a on the first select gate electrode SG1 side and a contact electrode 24a on the bit line BL side. The contact electrode 22a and the contact electrode 24a correspond to the contact electrode 22 illustrated in FIG. 2 (contact electrode VA1 illustrated in FIG. 1).

The source line SL is electrically connected to the other end of the second semiconductor pillar SP2 (the end on the opposite side from the semiconductor connecting portion SC, i.e., the first semiconductor connecting portion SC1).

In this example, the source line SL is electrically connected to the other end of the second semiconductor pillar SP2 through a contact electrode 22b.

In this example, the first electrode film 61a and the second electrode film 61b extend in the third direction (X-axis direction) perpendicular to the first direction (Z-axis direction) and the second direction (Y-axis direction). The bit line BL extends along the Y-axis direction. On the other hand, the source line SL extends along the X-axis direction.

Furthermore, the first select gate electrode SG1 and the second select gate electrode SG2 extend along the X-axis direction. That is, the first select gate electrode SG1 and the second select gate electrode SG2 extend along a direction parallel to the extending direction of the first electrode film 61a and the second electrode film 61b.

A first select gate transistor SGT1 is formed at the intersection between the first select gate electrode SG1 and the first semiconductor pillar SP1. A second select gate transistor SGT2 is formed at the intersection between the second select gate electrode SG2 and the second semiconductor pillar SP2. The select gate insulating film SGI functions as a gate insulating film of these select gate transistors. These select gate transistors have a function of selecting the semiconductor pillar SP.

As illustrated in FIG. 2, the nonvolatile semiconductor memory device 110 can further include a third semiconductor pillar SP3, a fourth semiconductor pillar SP4, and a second semiconductor connecting portion SC2.

The third semiconductor pillar SP3 is adjacent to the second semiconductor pillar SP2 on the opposite side of the second semiconductor pillar SP2 from the first semiconductor pillar SP1 in the Y-axis direction. The fourth semiconductor pillar SP4 is adjacent to the third semiconductor pillar SP3 on the opposite side of the third semiconductor pillar SP3 from the second semiconductor pillar SP2 in the Y-axis direction.

The third semiconductor pillar SP3, the fourth semiconductor pillar SP4, and the second semiconductor connecting portion SC2 can be based on the configuration described with reference to the first semiconductor pillar SP1, the second semiconductor pillar SP2, and the first semiconductor connecting portion SC1, respectively.

More specifically, the third semiconductor pillar SP3 pierces a third stacked structure along the Z-axis direction. The fourth semiconductor pillar SP4 pierces a fourth stacked structure along the Z-axis direction. The second semiconductor connecting portion SC2 electrically connects one end of the third semiconductor pillar SP3 and one end of the fourth semiconductor pillar SP4.

The first interconnection (bit line BL) is further connected to the other end of e.g. the fourth semiconductor pillar SP4 on the opposite side from the second semiconductor connecting portion SC2. The second interconnection (source line SL) is further connected to the other end of the third semiconductor pillar SP3 on the opposite side from the second semiconductor connecting portion SC2.

As illustrated in FIG. 1, the first semiconductor pillar SP1 is connected to the bit line BL by a contact electrode VA1. The fourth semiconductor pillar SP4 is connected to the bit line BL by a contact electrode VA2.

In the following, an example of the non-memory unit PU is described.

As shown in FIG. 1, the non-memory unit PU further includes a peripheral circuit unit PCU in addition to the dummy conductive film 65, the dummy select gate electrode SGd, the first non-memory unit contact electrode 71p, and the second non-memory unit contact electrode 72p described above. The peripheral circuit unit PCU includes a peripheral circuit transistor 51 provided between the substrate 11 and the dummy conductive film 65.

More specifically, an interlayer insulating film 13 is provided as a device isolation insulating layer (STI, shallow trench isolation) on the major surface 11a side of the substrate 11 (e.g., silicon substrate). The portion of the substrate 11 (silicon substrate) on the major surface 11a side is divided by the interlayer insulating film 13. An insulating film 13g is provided on the substrate 11 divided by the STI. A peripheral circuit gate electrode 52 is provided on the insulating film 13g. The insulating film 13g opposed to the peripheral circuit gate electrode 52 serves as a gate insulating film of the peripheral circuit transistor 51. The peripheral circuit gate electrode 52 serves as a gate electrode of the peripheral circuit transistor 51.

The peripheral circuit gate electrode 52 is in the same layer as e.g. the connecting portion conductive layer SCC of the memory unit MU. The peripheral circuit gate electrode 52 is made of the same material as e.g. the connecting portion conductive layer SCC of the memory unit MU.

The peripheral circuit gate electrode 52 is connected to e.g. an interconnection 73 through a contact electrode 73p.

The portion of the substrate 11 (silicon substrate) constituting another portion of the peripheral circuit unit PCU is connected to an interconnection 74 through a contact electrode 74p.

The contact electrode 73p and the contact electrode 74p pierce through the dummy conductive film 65 and the dummy select gate electrode SGd along the Z-axis direction.

An interlayer insulating film 731 is provided between the contact electrode 73p and the dummy conductive film 65, and between the contact electrode 73p and the dummy select gate electrode SGd. An interlayer insulating film 741 is provided between the contact electrode 74p and the dummy conductive film 65, and between the contact electrode 74p and the dummy select gate electrode SGd.

As described above, the non-memory unit PU further includes a peripheral circuit contact electrode (contact electrode 73p) and a peripheral circuit contact interlayer insulating film (interlayer insulating film 731). The peripheral circuit contact electrode (contact electrode 73p) is electrically connected to the gate electrode (peripheral circuit gate electrode 52) of the peripheral circuit transistor 51 and extends along the Z-axis direction. The peripheral circuit contact interlayer insulating film (interlayer insulating film 731) is provided between the peripheral circuit contact electrode (contact electrode 73p) on one hand and the dummy conductive film 65 and the dummy select gate electrode SGd on the other.

The non-memory unit PU can further include a peripheral circuit substrate contact electrode (contact electrode 74p) and a peripheral circuit substrate contact interlayer insulating film (interlayer insulating film 741). The peripheral circuit substrate contact electrode (contact electrode 74p) is electrically connected to the substrate 11 and extends along the Z-axis direction. The peripheral circuit substrate contact interlayer insulating film (interlayer insulating film 741) is provided between the peripheral circuit substrate contact electrode (contact electrode 74p) on one hand and the dummy conductive film 65 and the dummy select gate electrode SGd on the other.

The peripheral circuit unit PCU can include a plurality of peripheral circuit transistors 51 thus configured. The peripheral circuit unit PCU is operable to e.g. control the potential of various conductive layers included in the memory unit MU and supply current to the conductive layers.

An interlayer insulating film 53 is provided around the peripheral circuit transistor 51. The dummy conductive film 65, the dummy select gate electrode SGd, the first non-memory unit contact electrode 71p, and the second non-memory unit contact electrode 72p described above are provided on the interlayer insulating film 53.

The interlayer insulating film 18, interlayer insulating film 19, and interlayer insulating film 23 are provided on the dummy select gate electrode SGd. The interconnection 71, interconnection 72, interconnection 73, and interconnection 74 are provided on the interlayer insulating film 23. An interlayer insulating film 24 is provided between the interconnection 71, interconnection 72, interconnection 73, and interconnection 74. The interlayer insulating film 25 is provided on the interconnection 71, interconnection 72, interconnection 73, and interconnection 74. A metal interconnection 28b connected to the interconnection 71 and the interconnection 72, a metal interconnection 28c connected to the interconnection 73, and a metal interconnection 28d connected to the interconnection 74, for instance, are provided on the interlayer insulating film 25. The interlayer insulating film 27 is provided around the metal interconnection 28b, metal interconnection 28c, and metal interconnection 28d. The passivation film 29 is provided on the interlayer insulating film 27.

In the nonvolatile semiconductor memory device 110 thus configured, the dummy conductive film 65 of the non-memory unit PU formed at the time of forming the electrode film 61 of the memory unit MU, and the dummy select gate electrode SGd of the non-memory unit PU formed at the time of forming the select gate electrode SG of the memory unit MU are placed at a prescribed potential. Thus, electrical interference between nodes with different potentials is suppressed.

For instance, if the dummy conductive film 65 and the dummy select gate electrode SGd are placed in the floating state, then the contact electrode 73p and the contact electrode 74p to be controlled to a prescribed potential for the operation of the peripheral circuit transistor 51 may electrically interfere with each other through the dummy conductive film 65 and the dummy select gate electrode SGd. Consequently, the potential of the contact electrode 73p and the potential of the contact electrode 74p may be made unstable. Thus, if the dummy conductive film 65 and the dummy select gate electrode SGd are placed in the floating state, the potential of various conductive layers included in the non-memory unit PU may be made unstable. Furthermore, if the dummy conductive film 65 and the dummy select gate electrode SGd are placed in the floating state, the potential of various conductive layers included in the memory unit MU may be made unstable.

However, in this embodiment, the dummy conductive film 65 and the dummy select gate electrode SGd of the non-memory unit PU are placed at a prescribed potential. Thus, electrical interference between nodes with different potentials is suppressed, and stable operation can be achieved. That is, in the nonvolatile semiconductor memory device 110, more stable operation can be achieved.

For instance, the potential of the first non-memory unit contact electrode 71p and the potential of the second non-memory unit contact electrode 72p can be made equal to or higher than the minimum of the application voltage applied to the peripheral circuit transistor 51, and equal to or lower than the maximum of the application voltage. Thus, the voltage generated in the peripheral circuit transistor 51, the contact electrode 73p, and the contact electrode 74p due to e.g. electrostatic induction does not exceed the range of the application voltage of the peripheral circuit transistor 51. Hence, damage and unstable operation of the peripheral circuit transistor 51 can be suppressed more effectively. Furthermore, stress on the interlayer insulating films can be reduced. Thus, for instance, the reliability is improved.

More preferably, the potential of the first non-memory unit contact electrode 71p and the potential of the second non-memory unit contact electrode 72p are higher than the minimum of the application voltage applied to the peripheral circuit transistor 51, and lower than the maximum of the application voltage. This can further suppress damage and unstable operation of the peripheral circuit transistor 51.

Still more preferably, the potential of the first non-memory unit contact electrode 71p and the potential of the second non-memory unit contact electrode 72p are an intermediate potential between the minimum and the maximum of the application voltage applied to the peripheral circuit transistor 51.

More specifically, the difference between the potential of the first non-memory unit contact electrode 71p and the minimum of the application voltage can be made substantially equal to the difference between the potential of the first non-memory unit contact electrode 71p and the maximum of the application voltage. For instance, the voltage applied to the first non-memory unit contact electrode 71p is set to within ±10% of the intermediate value between the minimum and the maximum of the application voltage applied to the peripheral circuit transistor 51.

Furthermore, the difference between the potential of the second non-memory unit contact electrode 72p and the minimum of the application voltage can be made substantially equal to the difference between the potential of the second non-memory unit contact electrode 72p and the maximum of the application voltage. For instance, the voltage applied to the second non-memory unit contact electrode 72p is set to within ±10% of the intermediate value between the minimum and the maximum of the application voltage applied to the peripheral circuit transistor 51.

This can further suppress damage and unstable operation of the peripheral circuit transistor 51.

Furthermore, the first non-memory unit contact electrode 71p and the second non-memory unit contact electrode 72p can be placed at a potential lower than the potential of the substrate 11. This can improve e.g. the device isolation breakdown voltage. Thus, more stable operation can be achieved. Furthermore, the reliability can be further improved.

The potential of the first non-memory unit contact electrode 71p and the potential of the second non-memory unit contact electrode 72p may be either equal to or different from each other. For instance, the first non-memory unit contact electrode 71p and the second non-memory unit contact electrode 72p can be electrically connected.

In the following, an example method for manufacturing the nonvolatile semiconductor memory device 110 is described.

FIGS. 4 to 25 are sequential schematic cross-sectional views illustrating a method for manufacturing a nonvolatile semiconductor memory device according to the first embodiment.

These figures show the memory region MUR (matrix memory cell region MU1R and interconnection connecting region MU2R) and the non-memory region PUR.

Figure 4:
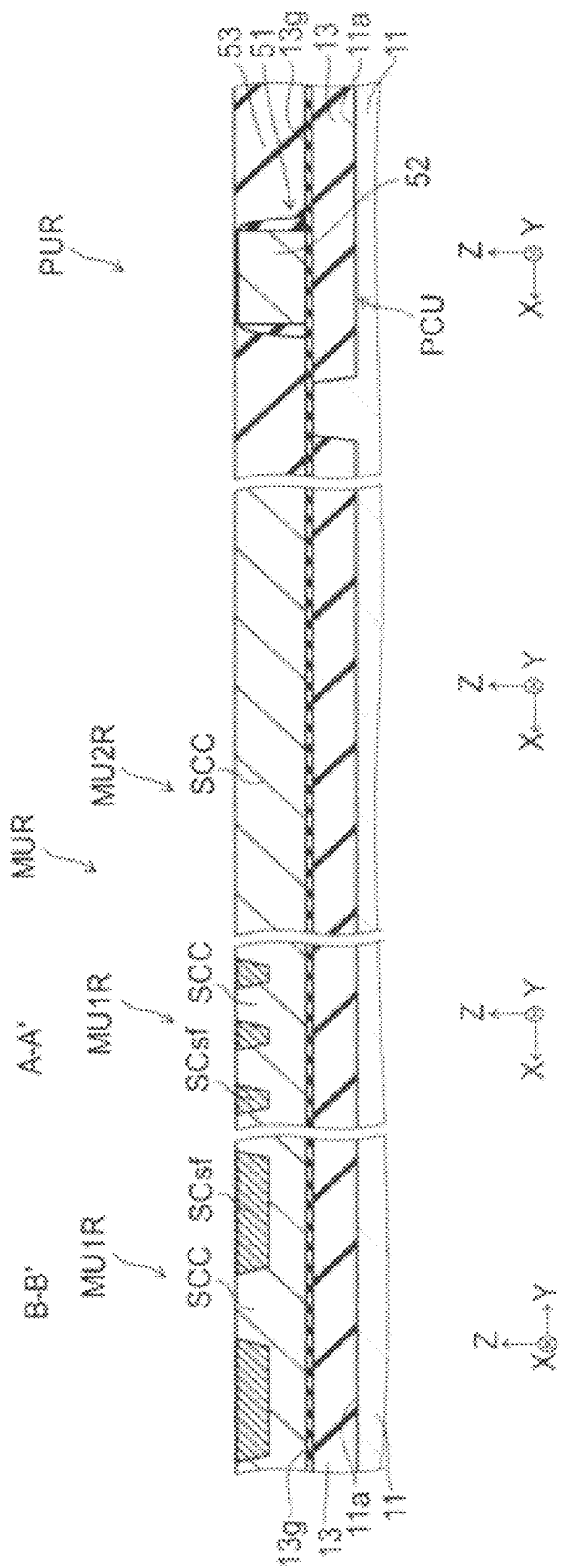
FIGS. 4 to 25 are sequential schematic cross-sectional views illustrating a method for manufacturing the nonvolatile semiconductor memory device according to the first embodiment.

As shown in FIG. 4, a peripheral circuit unit PCU including a peripheral circuit transistor 51 is formed on the major surface 11a of a substrate 11 such as a silicon substrate. More specifically, for instance, an interlayer insulating film 13 serving as an STI is formed in the major surface 11a of the substrate 11. Thus, divided semiconductor layers are formed on the major surface 11a side of the substrate 11. An insulating film 13g is provided on the surface of the semiconductor layer. A conductive film is formed on the insulating film 13g. This conductive film constitutes a peripheral circuit gate electrode 52 and a connecting portion conductive layer SCC. This conductive film is made of e.g. polysilicon.

In the non-memory region PUR, this conductive film is processed into a prescribed shape to form a peripheral circuit gate electrode 52. The semiconductor layer is doped with impurity through the peripheral circuit gate electrode 52 to form a diffusion region. Thus, a peripheral circuit transistor 51 is formed. Then, an interlayer insulating film 53 is formed so as to cover the peripheral circuit transistor 51.

On the other hand, in the matrix memory cell region MU1R, a connecting portion conductive layer SCC is formed from the aforementioned conductive film. In the connecting portion conductive layer SCC, a trench is formed in the region intended to form a semiconductor connecting portion SC. A buried sacrificial film SCsf is buried in this trench. The buried sacrificial film SCsf is made of e.g. silicon nitride.

Figure 5:
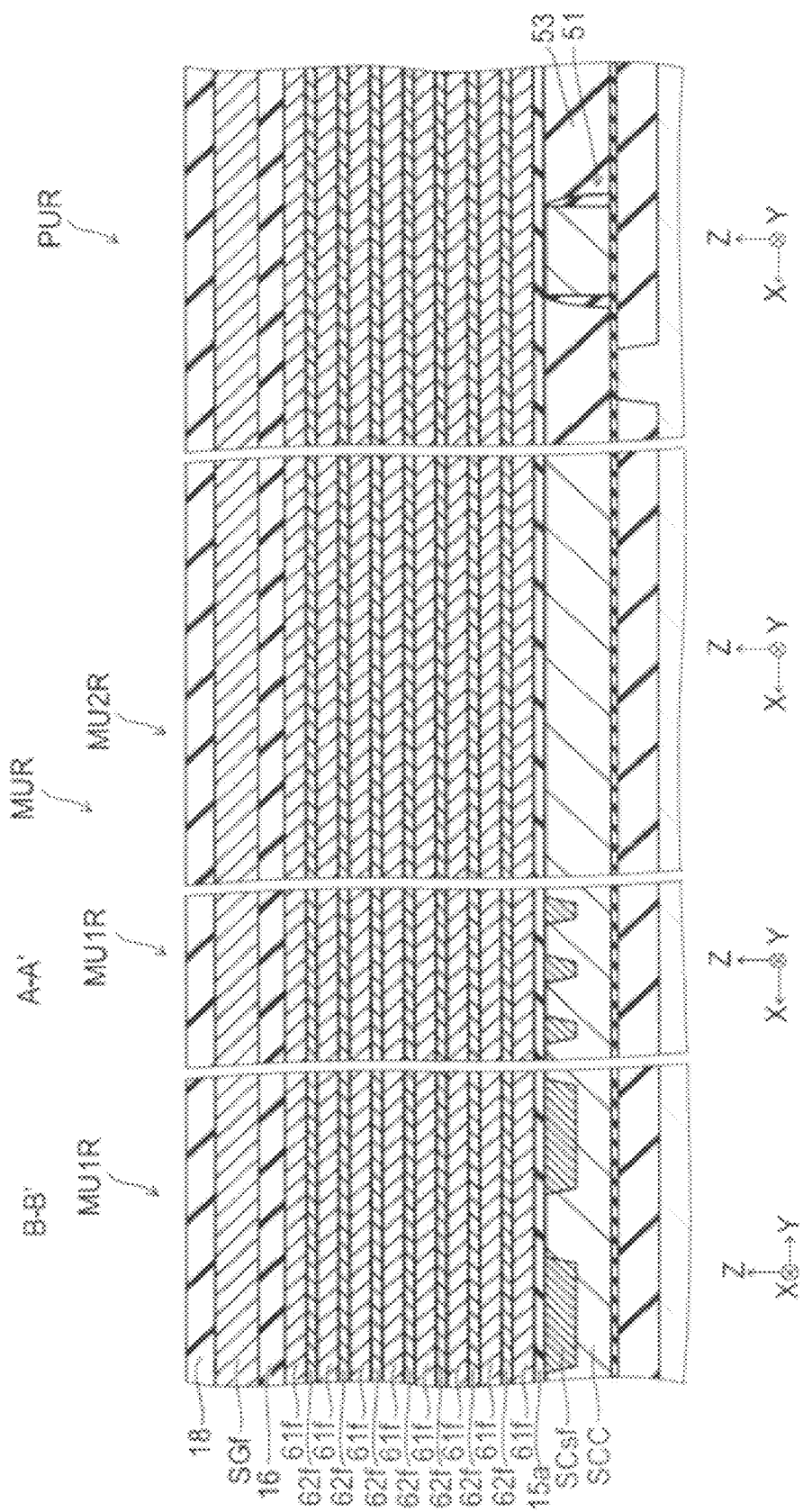

Next, as shown in FIG. 5, an insulating film 15a is formed on the connecting portion conductive layer SCC, the sacrificial film SCsf, the peripheral circuit transistor 51, and the interlayer insulating film 53. The insulating film 15a is made of e.g. silicon oxide.

Furthermore, above the interlayer insulating film 53, for instance, doped polysilicon films 61f doped with impurity and non-doped polysilicon films 62f not doped with impurity are alternately and repetitively deposited to form a stacked film serving as a preform for a stacked structure ML. Furthermore, an interlayer insulating film 16 is formed on this stacked film. A select gate electrode film SGf constituting a select gate electrode SG is formed on the interlayer insulating film 16. An interlayer insulating film 18 is formed on the select gate electrode film SGf. The select gate electrode film SGf is made of e.g. polysilicon doped with impurity.

Figure 6:
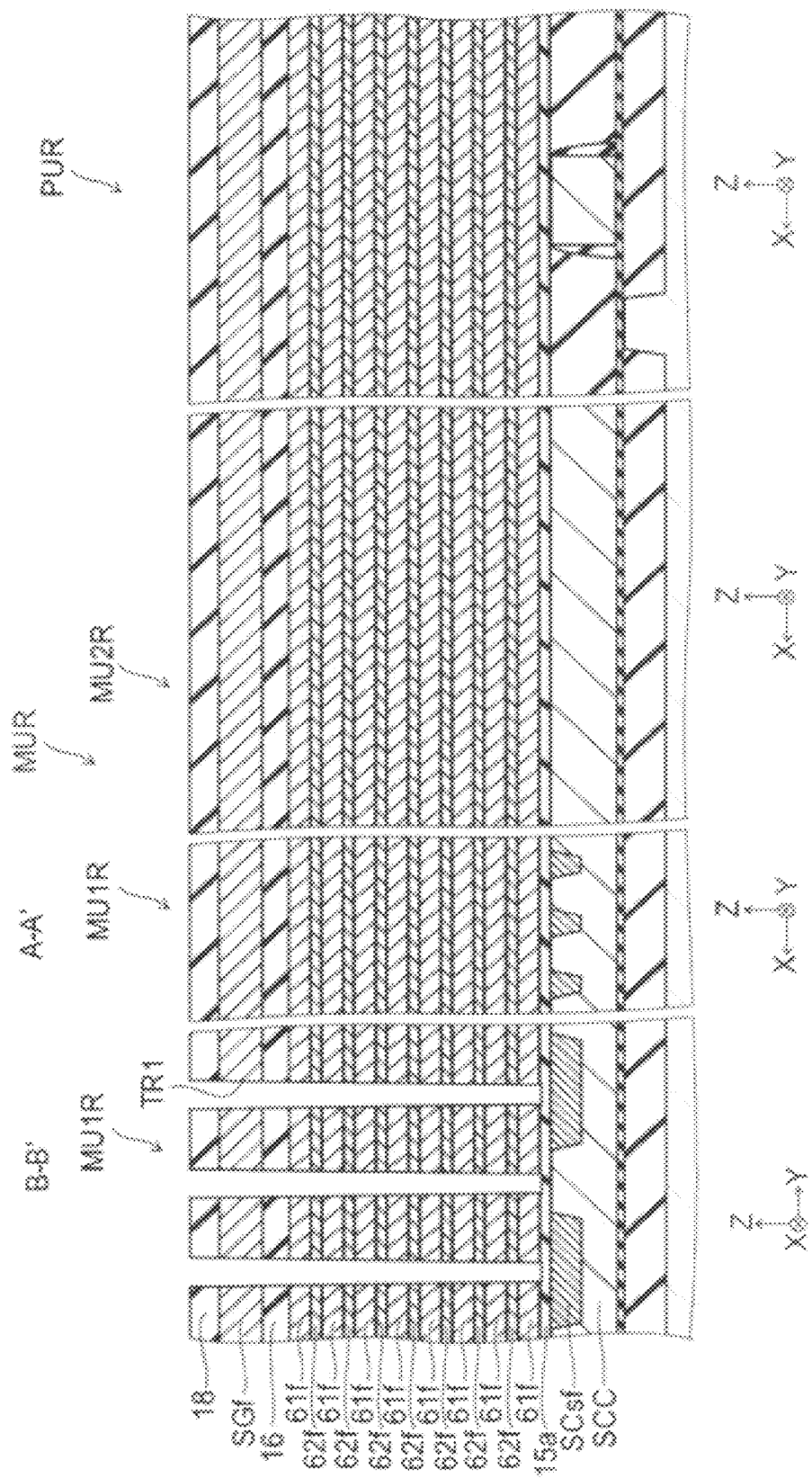

Next, as shown in FIG. 6, by lithography and RIE (reactive ion etching), a trench TR1 is formed in the stacked film including the doped polysilicon films 61f and the non-doped polysilicon films 62f, the interlayer insulating film 16, the select gate electrode film SGf, and the interlayer insulating film 18. Thus, the stacked film, the interlayer insulating film 16, the select gate electrode film SGf, and the interlayer insulating film 18 are processed into a line shape.

Figure 7:
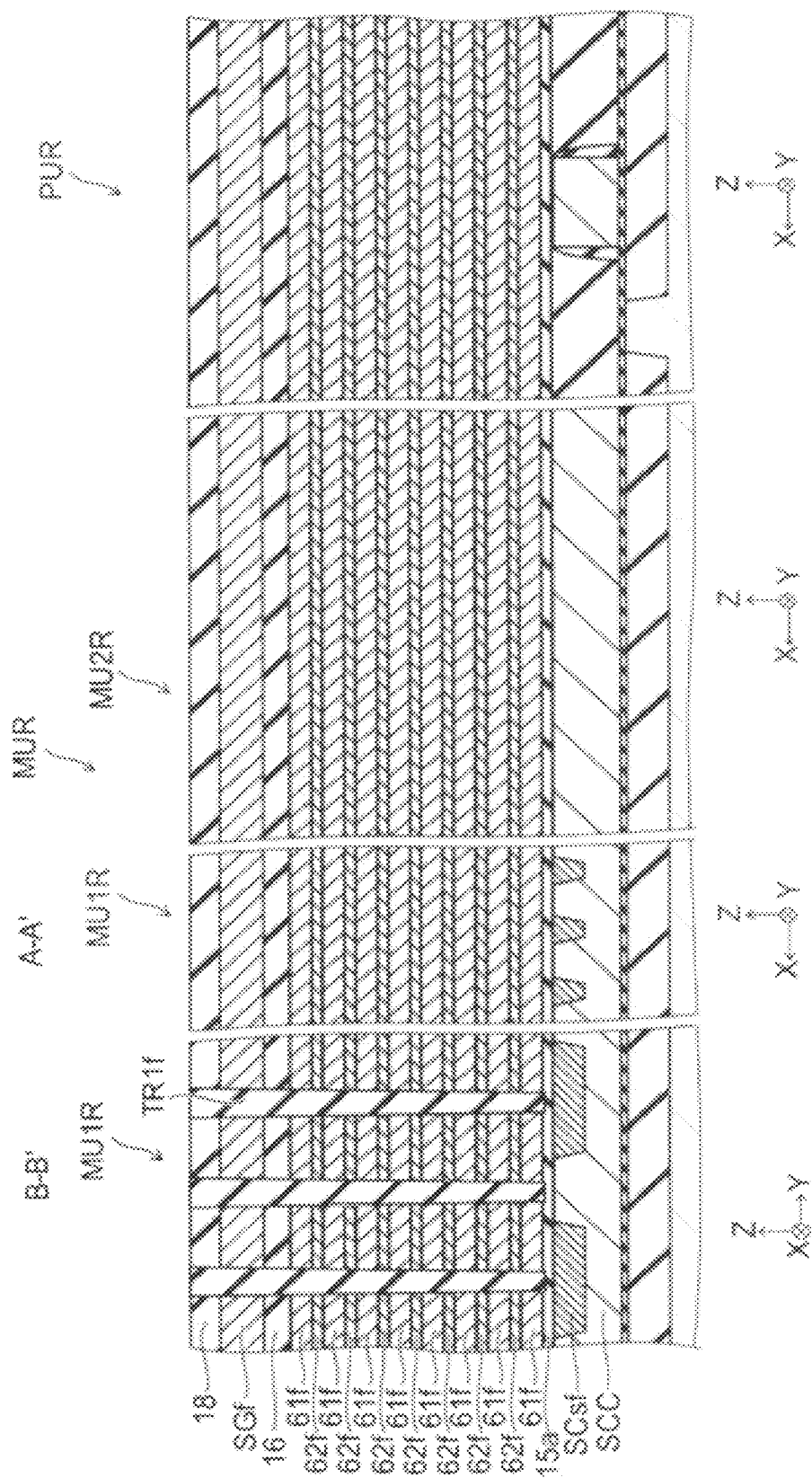

Next, as shown in FIG. 7, an insulating film TRf is buried in the trench TR1. The insulating film TRf is made of e.g. silicon nitride or silicon oxide. The insulating film TRf constitutes an interlayer insulating film ILP dividing the electrode films 61 from each other.

Figure 8:
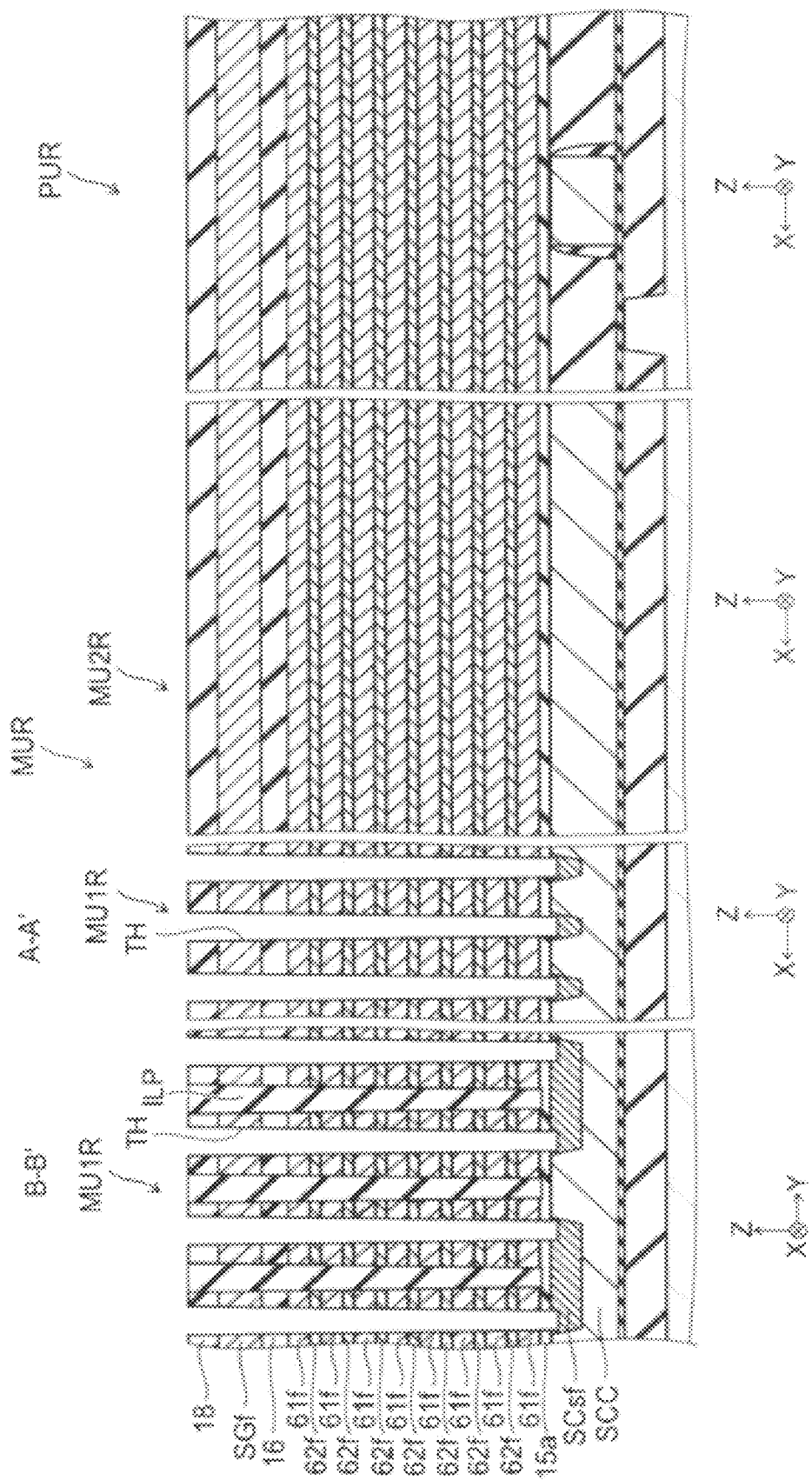

Next, as shown in FIG. 8, by lithography and RIE, a through hole TH is formed in the stacked film including the doped polysilicon films 61f and the non-doped polysilicon films 62f, the interlayer insulating film 16, the select gate electrode film SGf, and the interlayer insulating film 18.

Figure 9:
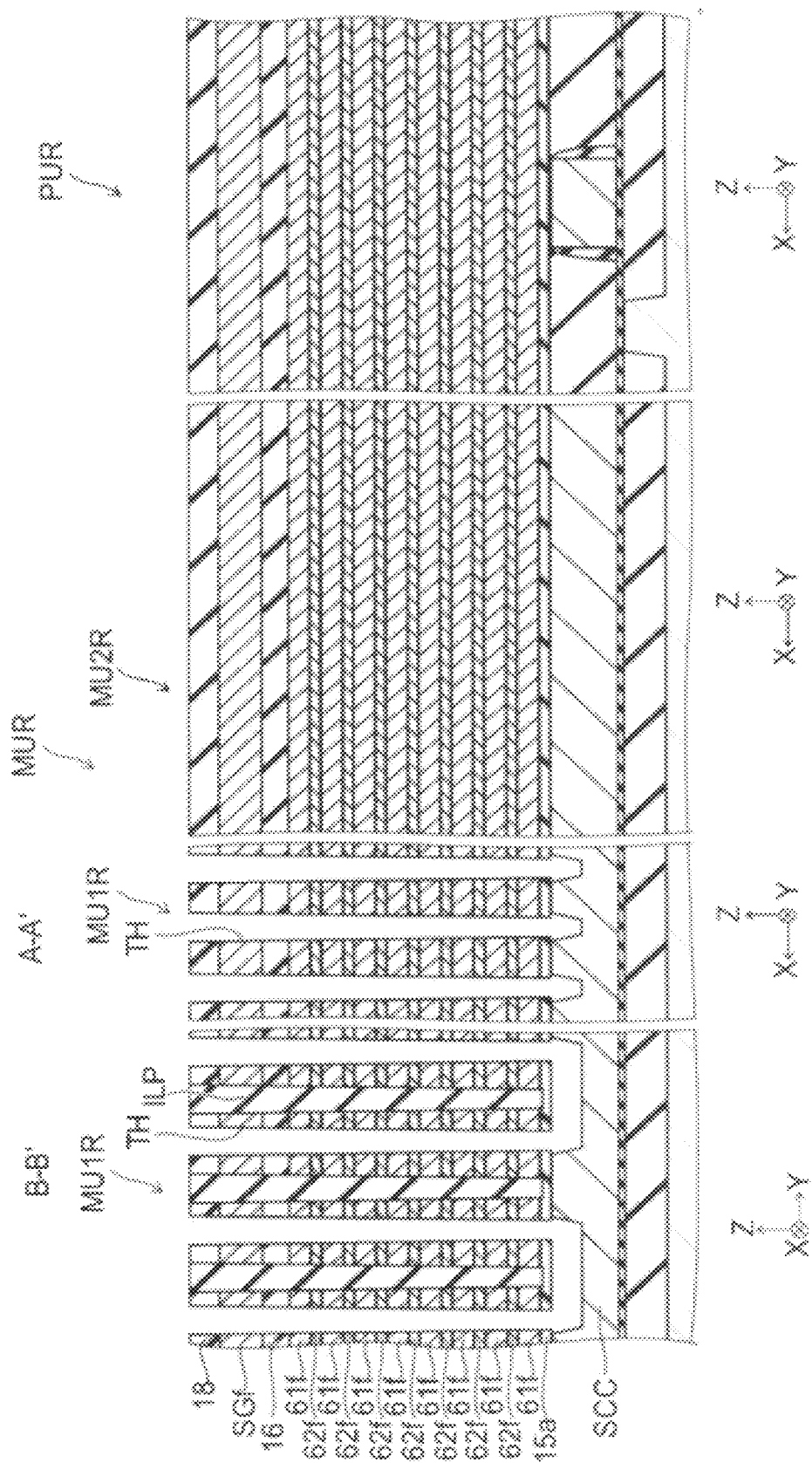

Next, as shown in FIG. 9, the buried sacrificial film SCsf is removed through the through hole TH using e.g. a hot phosphoric acid solution. This allows the bottom of two through holes TH to communicate with each other.

Figure 10:
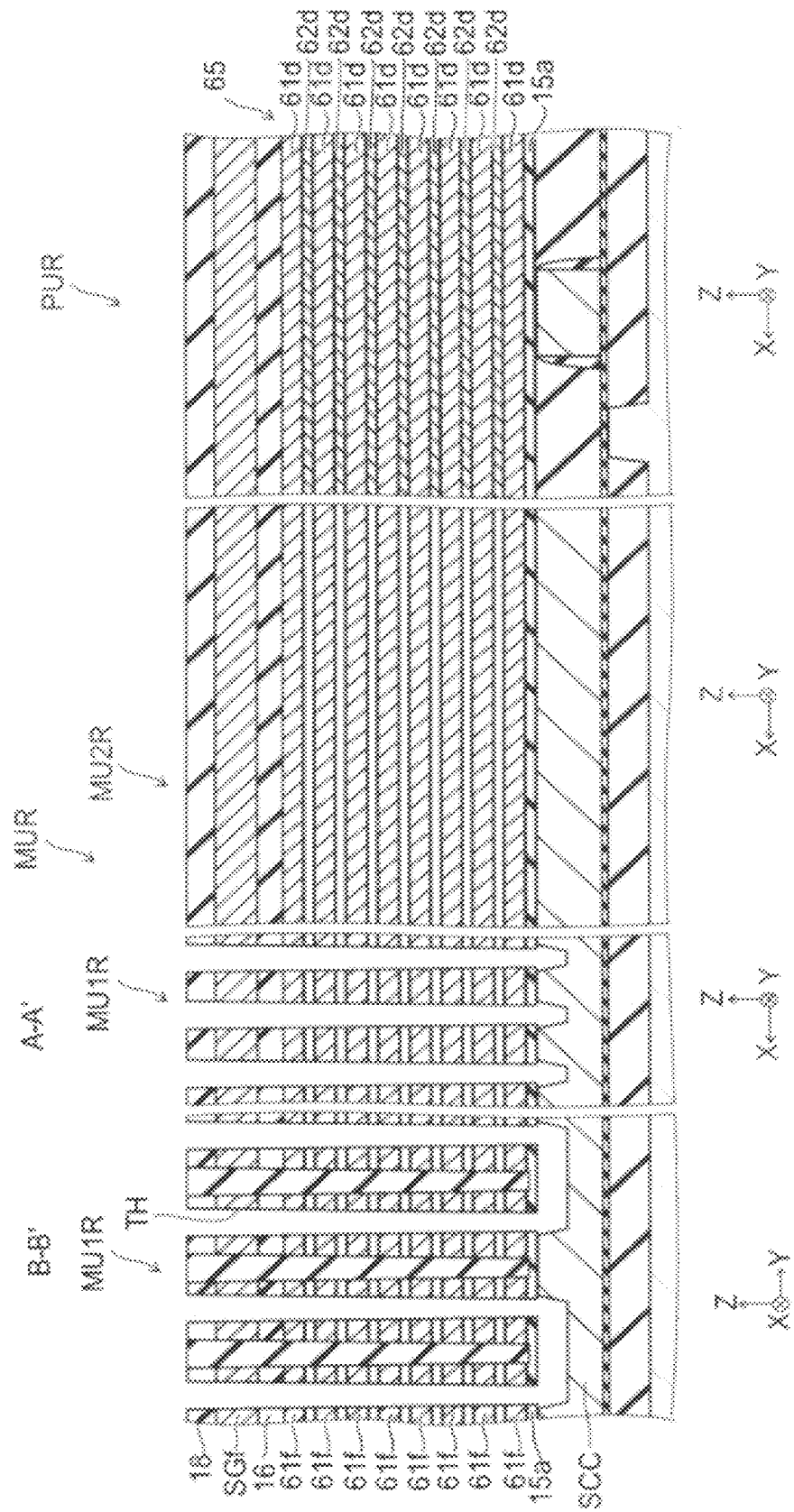

Next, as shown in FIG. 10, the non-doped polysilicon films 62f in the memory region MUR are removed. This can be performed using e.g. an alkaline chemical. The plurality of doped polysilicon films 61f stacked are supported by the insulating film TRf (interlayer insulating film ILP).

On the other hand, at this time, the non-doped polysilicon films 62f in the non-memory region PUR are not removed but left unchanged. The doped polysilicon film 61f in the non-memory region PUR constitutes a first dummy film 61d of the dummy conductive film 65. The non-doped polysilicon film 62f in the non-memory region PUR constitutes a second dummy film 62d of the dummy conductive film 65. That is, the dummy conductive film 65 is thus formed.

In this example, impurity contained in the doped polysilicon film 61f is diffused into the non-doped polysilicon film 62f by e.g. heat treatment during the process. Thus, the doped polysilicon film 61f (first dummy film 61d) and the non-doped polysilicon film 62f (second dummy film 62d) are integrated together, for instance. That is, in this example, the dummy conductive film 65 may be turned into an integrated conductive film, and the boundary between the first dummy film 61d and the second dummy film 62d may be made unclear.

Here, the select gate electrode film SGf in the non-memory region PUR constitutes a dummy select gate electrode SGd.

Figure 11:
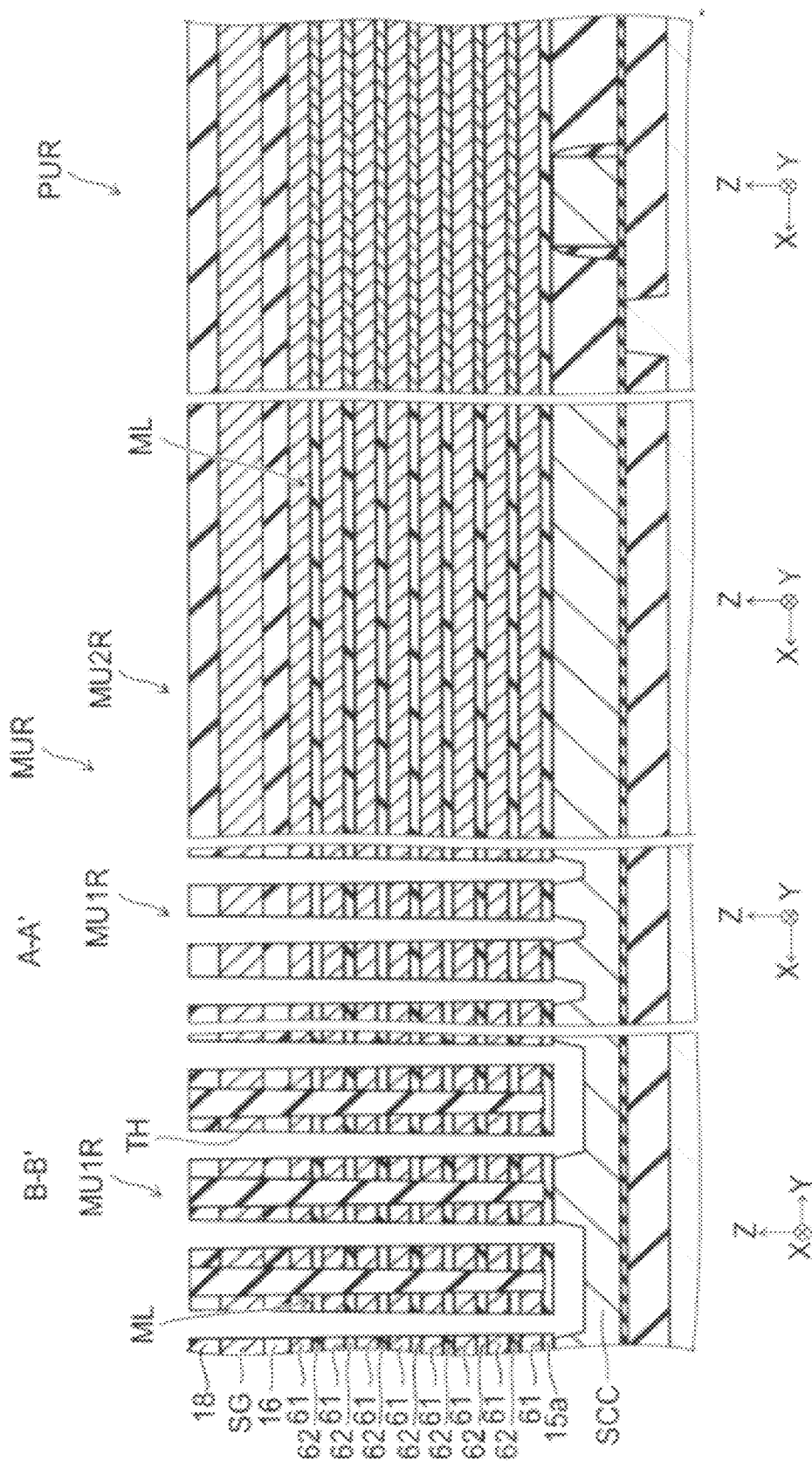

Next, as shown in FIG. 11, a silicon oxide film, for instance, is formed between the plurality of doped polysilicon films 61f by e.g. CVD (chemical vapor deposition). This silicon oxide film constitutes an interelectrode insulating film 62, and the doped polysilicon film 61f constitutes an electrode film 61. Thus, a stacked structure ML is formed.

Here, the spacing between the plurality of doped polysilicon films 61f (the thickness of the non-doped polysilicon film 62f) is designed to be smaller than the diameter of the through hole TH. Thus, the gap between the plurality of doped polysilicon films 61f can be filled with silicon oxide film without clogging the through hole TH.

Subsequently, the silicon oxide film deposited on the inner side surface of the through hole TH is removed by e.g. dilute hydrofluoric acid treatment.

Figure 12:
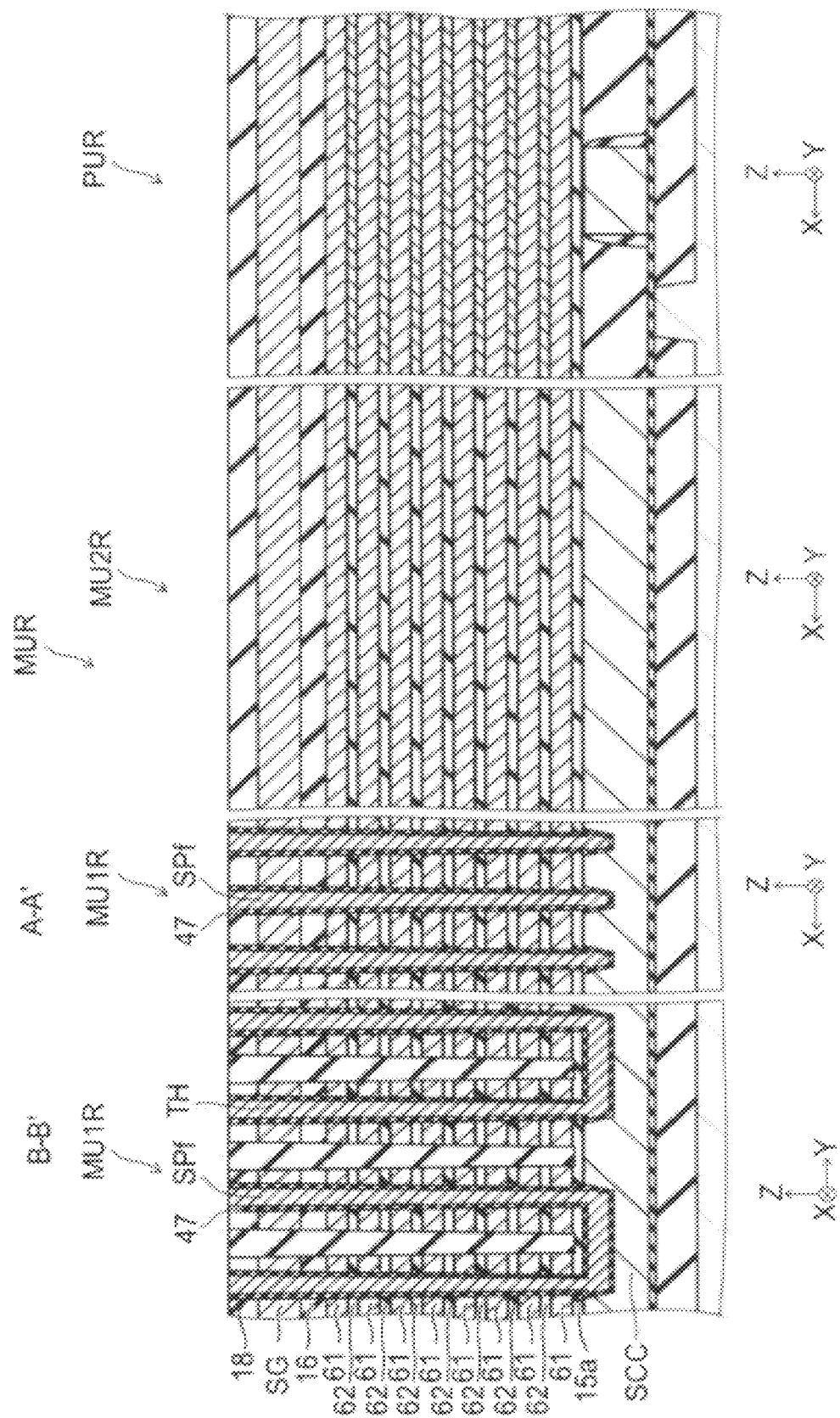

Next, as shown in FIG. 12, in continuation to the aforementioned dilute hydrofluoric acid treatment, a stacked insulating film 47 is formed. Furthermore, in continuation to the formation of the stacked insulating film 47, a semiconductor pillar film SPf constituting a semiconductor pillar SP is formed. More specifically, the stacked insulating film 47 is formed as follows. Silicon oxide films, for instance, are formed as a first pillar portion outer insulating film 43p1, a second pillar portion outer insulating film 43p2, and a first connecting portion outer insulating film 43c1. Silicon nitride films, for instance, are formed as a first pillar portion memory layer 48p1, a second pillar portion memory layer 48p2, and a first connecting portion memory layer 48c1. Furthermore, silicon oxide films, for instance, are formed as a first pillar portion inner insulating film 42p1, a second pillar portion inner insulating film 42p2, and a first connecting portion inner insulating film 42c1. Then, a polysilicon film, for instance, is formed as a semiconductor pillar film SPf.

Here, for instance, after the formation of the stacked insulating film 47, the semiconductor pillar film SPf is formed without any preprocessing on the surface of the stacked insulating film 47.

Then, the silicon oxide film (the film serving as an interelectrode insulating film 62), the stacked insulating film 47, and the semiconductor pillar film SPf formed on the surface of the interlayer insulating film 18 are removed by e.g. RIE.

Figure 13:
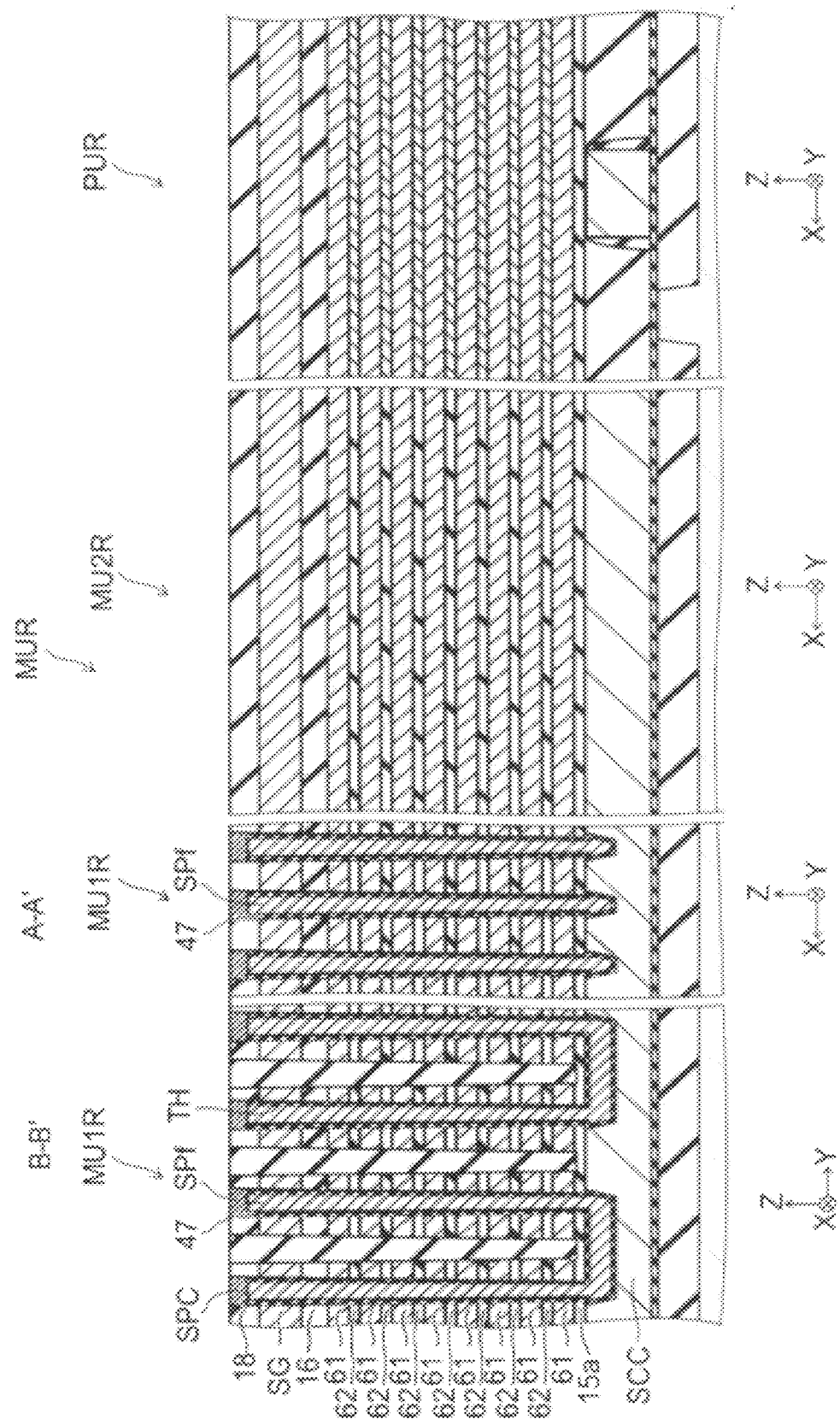

Next, as shown in FIG. 13, part of the semiconductor pillar film SPf buried in the through hole TH is set back by e.g. RIE. Then, a polysilicon film (e.g., a polysilicon film doped with impurity) serving as a semiconductor pillar contact portion SPC is buried in the space above the through hole TH and planarized. Thus, a U-shaped memory string is formed.

Figure 14:
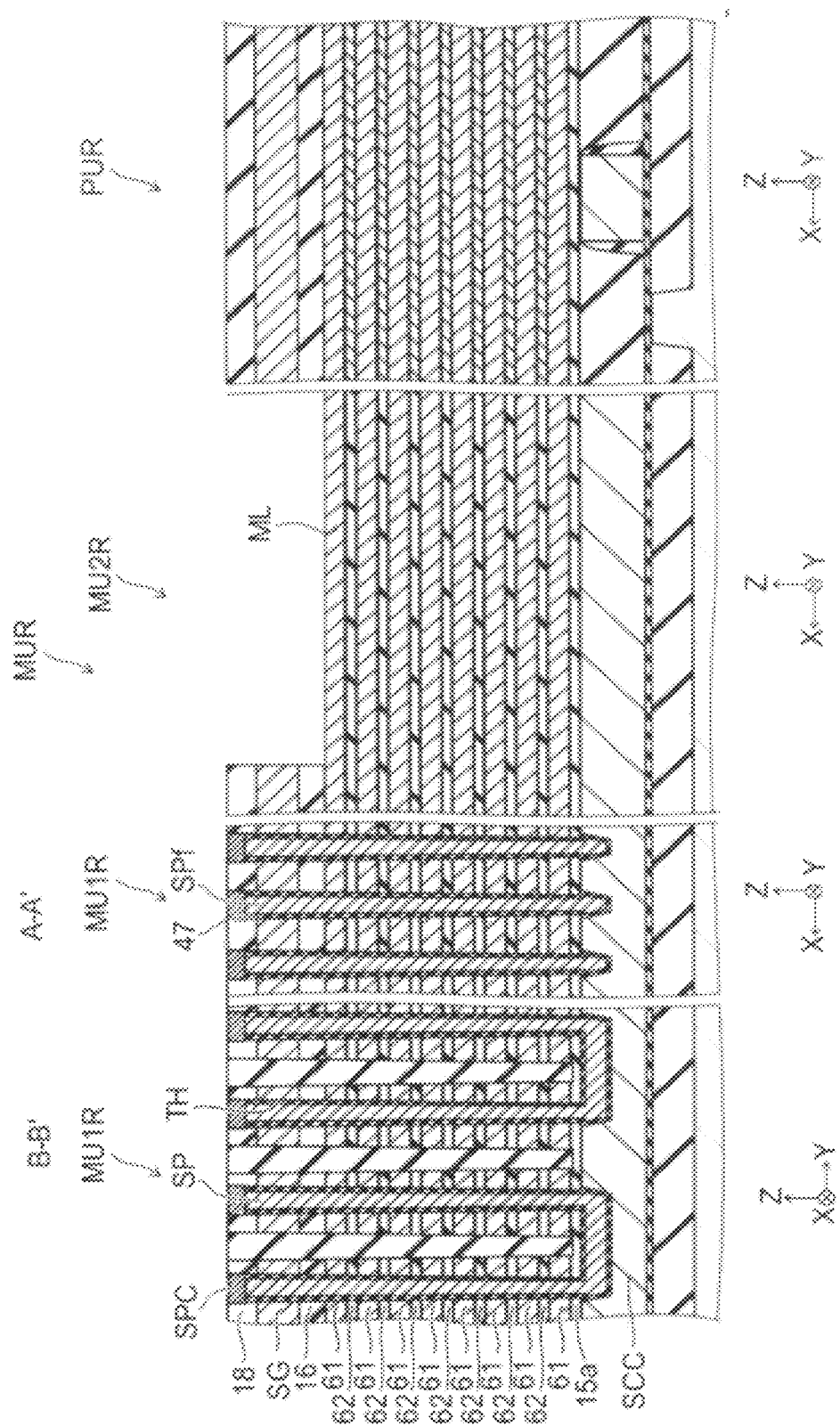

Next, as shown in FIG. 14, in the interconnection connecting region MU2R, the interlayer insulating film 16, the select gate electrode film SGf, and the interlayer insulating film 18 are removed by lithography and RIE to expose the upper surface of the stacked structure ML.

Figure 15:
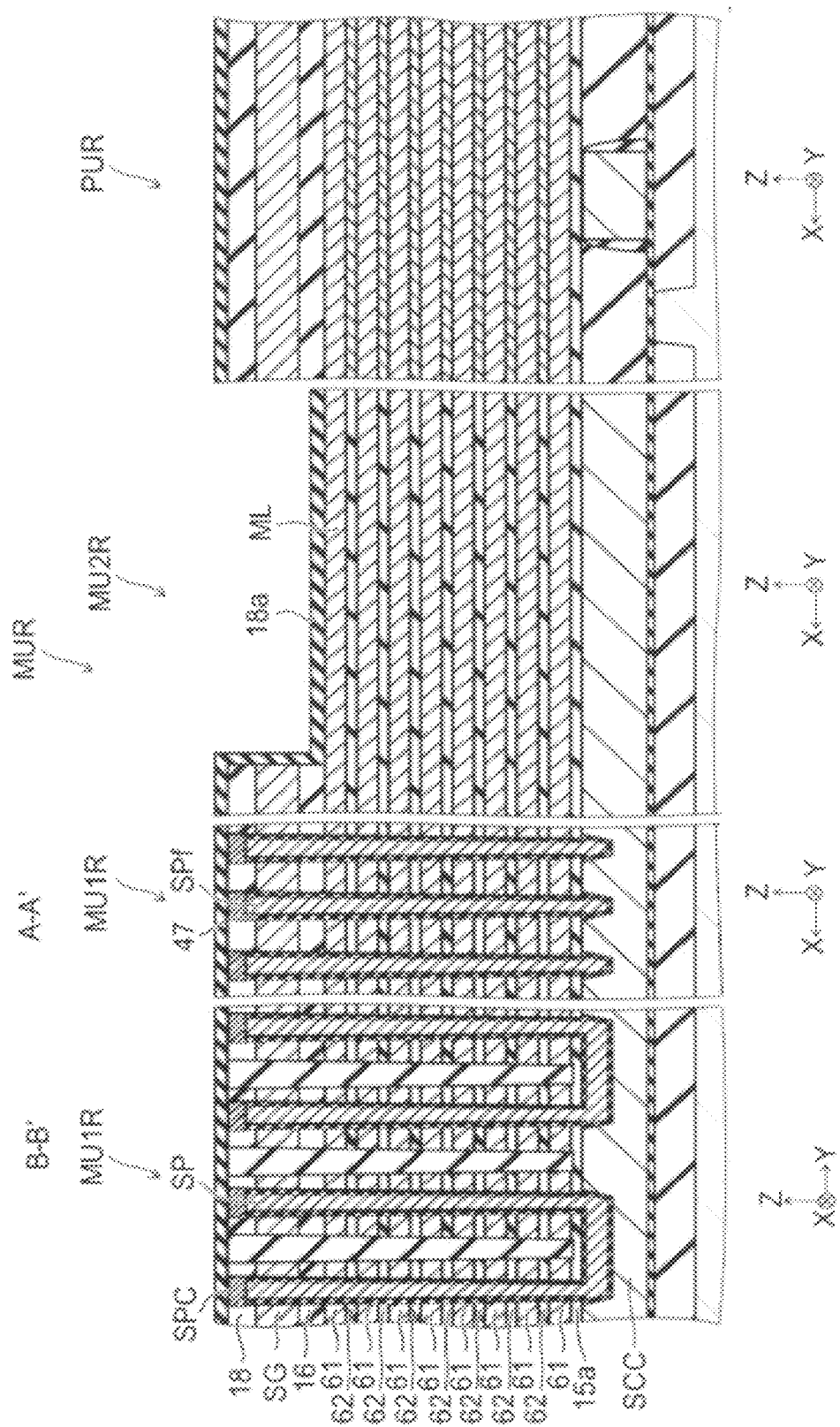

Next, as shown in FIG. 15, an interlayer insulating film 18a is formed. This interlayer insulating film 18a can be made of e.g. silicon oxide.

Figure 16:
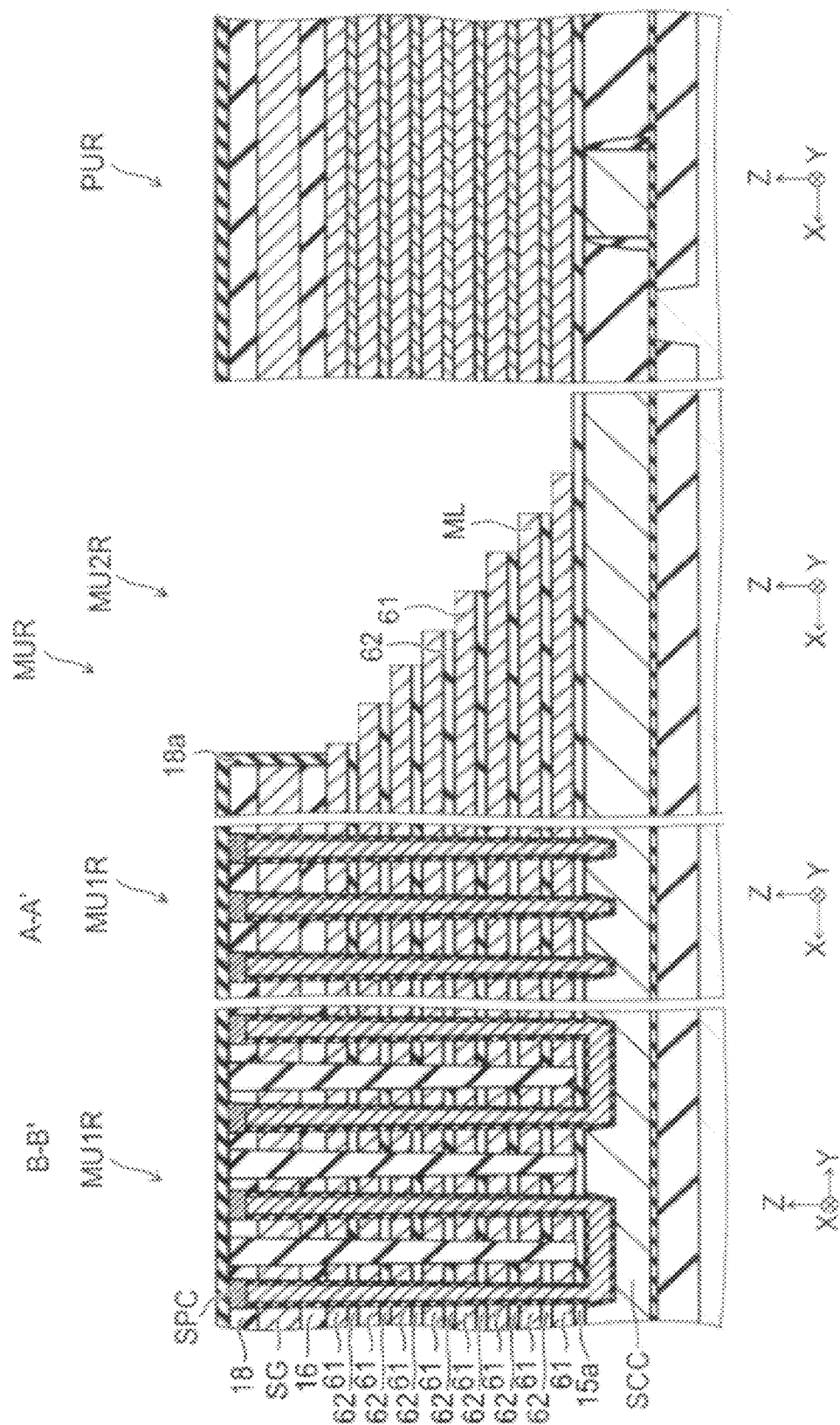

Next, as shown in FIG. 16, in the interconnection connecting region MU2R, the end portion of the electrode films 61 is processed into a staircase pattern by repeating slimming of a resist film and RIE.

Figure 17:
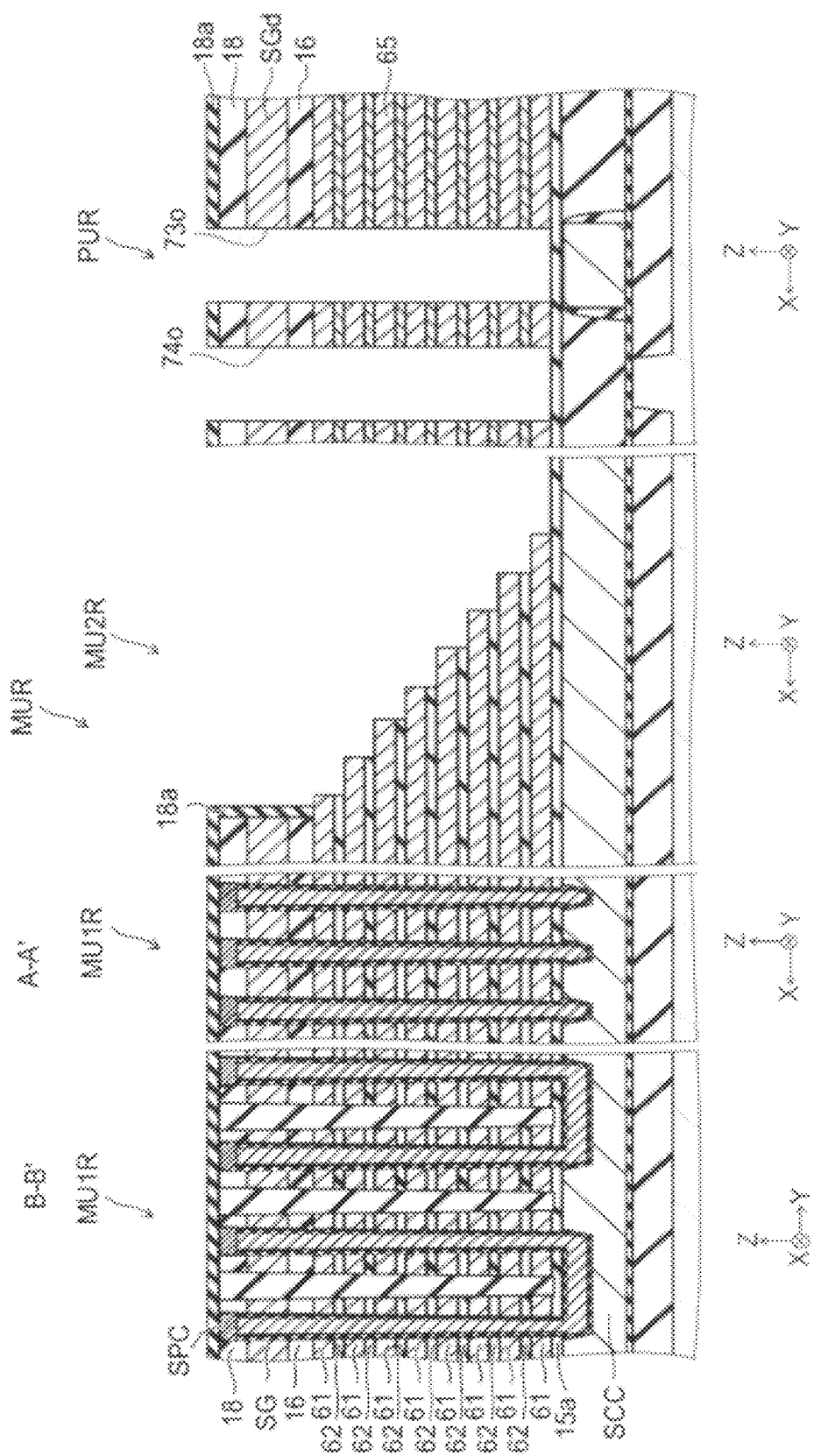

Next, as shown in FIG. 17, an opening 73o is formed in the portion of the stacked film (interlayer insulating film 18a, interlayer insulating film 18, dummy select gate electrode SGd, interlayer insulating film 16, and dummy conductive film 65) intended to form a contact electrode 73p. An opening 74o is formed in the portion of the stacked film (interlayer insulating film 18a, interlayer insulating film 18, dummy select gate electrode SGd, interlayer insulating film 16, and dummy conductive film 65) intended to form a contact electrode 74p.

Figure 18:
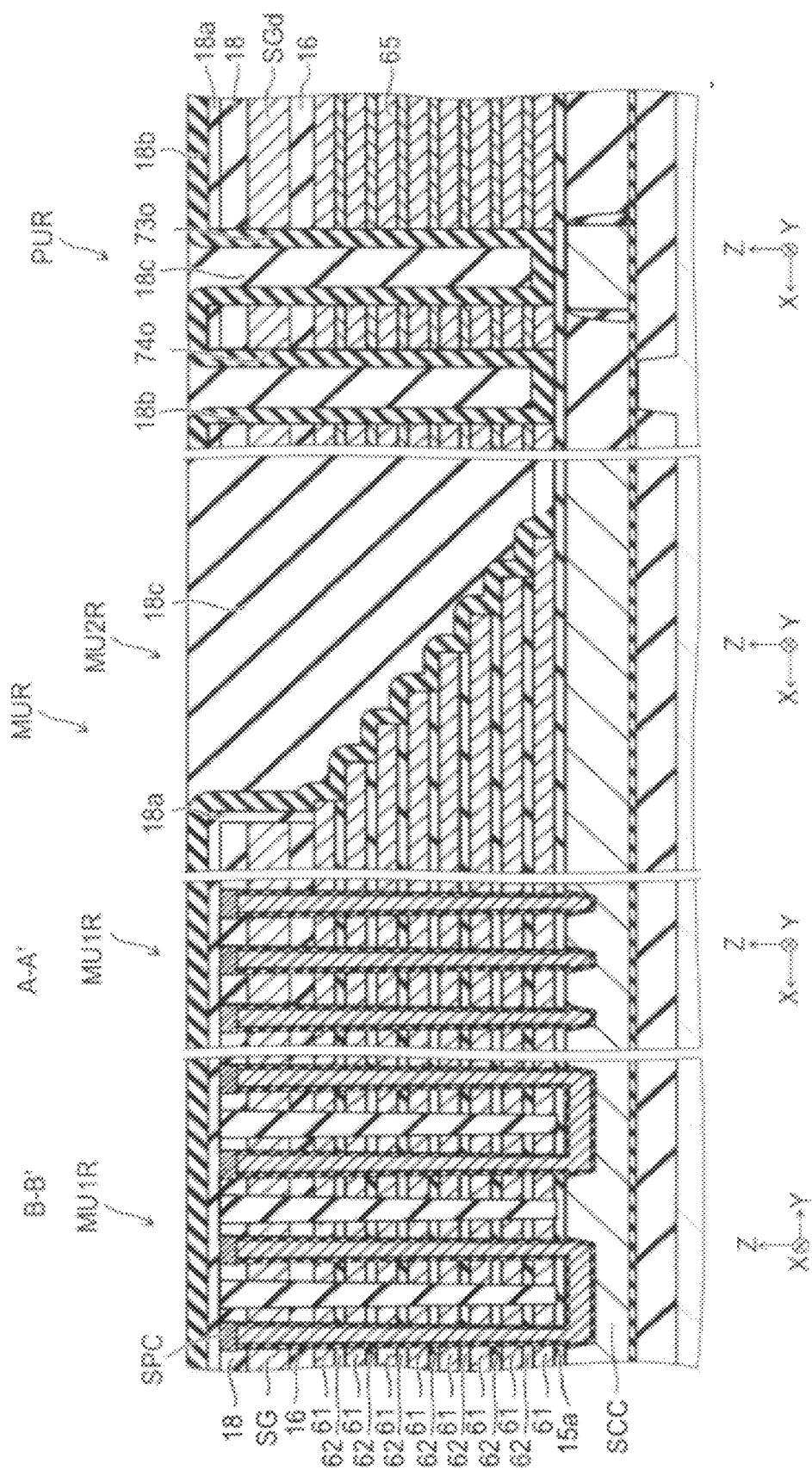

Next, as shown in FIG. 18, a silicon nitride film, for instance, is formed as a stopper film 18b on the inner wall surface of the opening 73o and the opening 74o. The stopper film 18b is formed also above the interlayer insulating film 18a, and the electrode film 61 exposed in the interconnection connecting region MU2R. Subsequently, an interlayer insulating film 18c is further formed on the stopper film 18b and planarized. Thus, part of the upper surface of the stopper film 18b is exposed. The interlayer insulating film 18c is made of e.g. silicon oxide.

Figure 19:
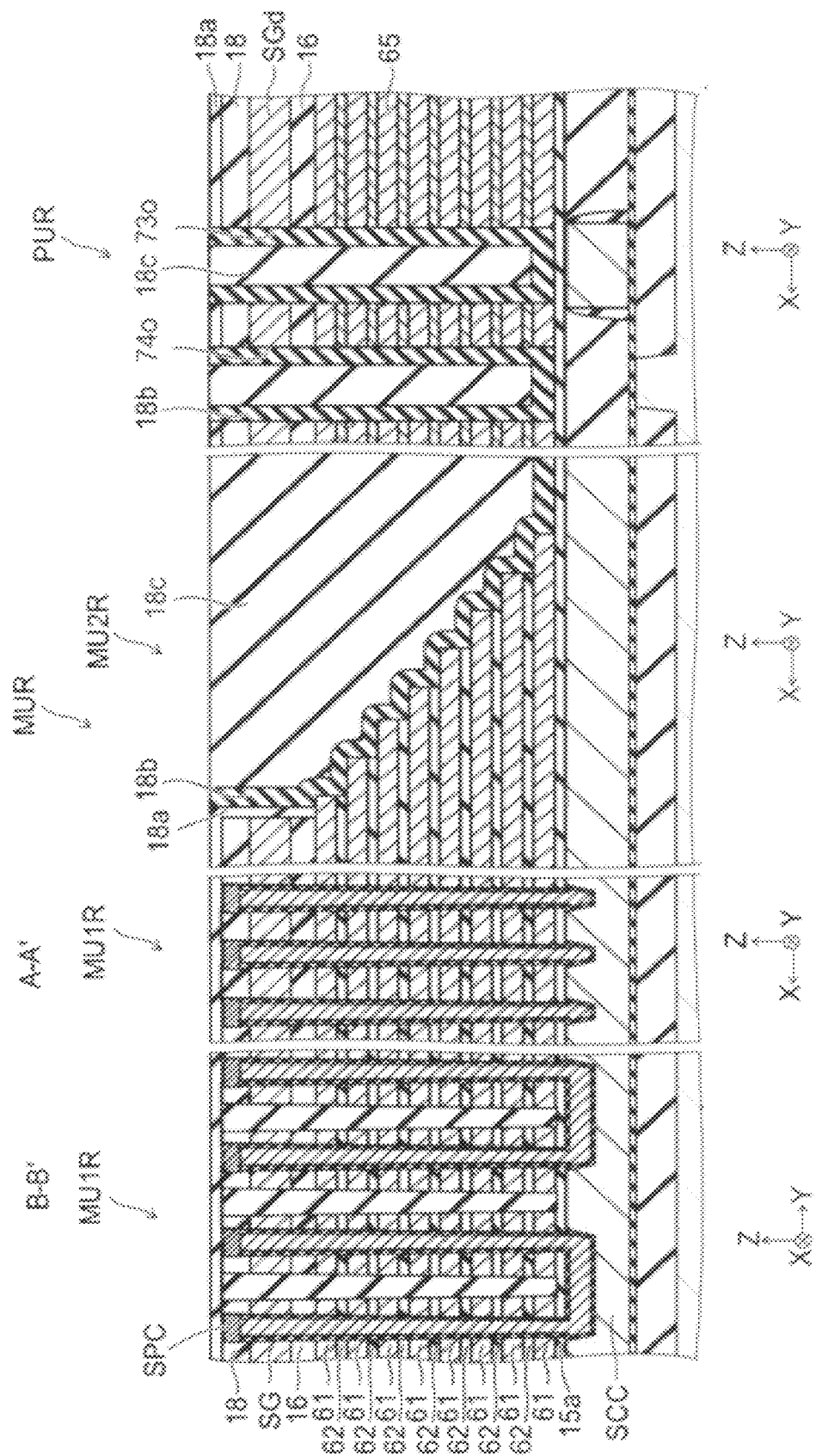

Next, as shown in FIG. 19, the stopper film 18b at the surface, and the surface portion of the interlayer insulating film 18c are moved by e.g. RIE.

Figure 20:
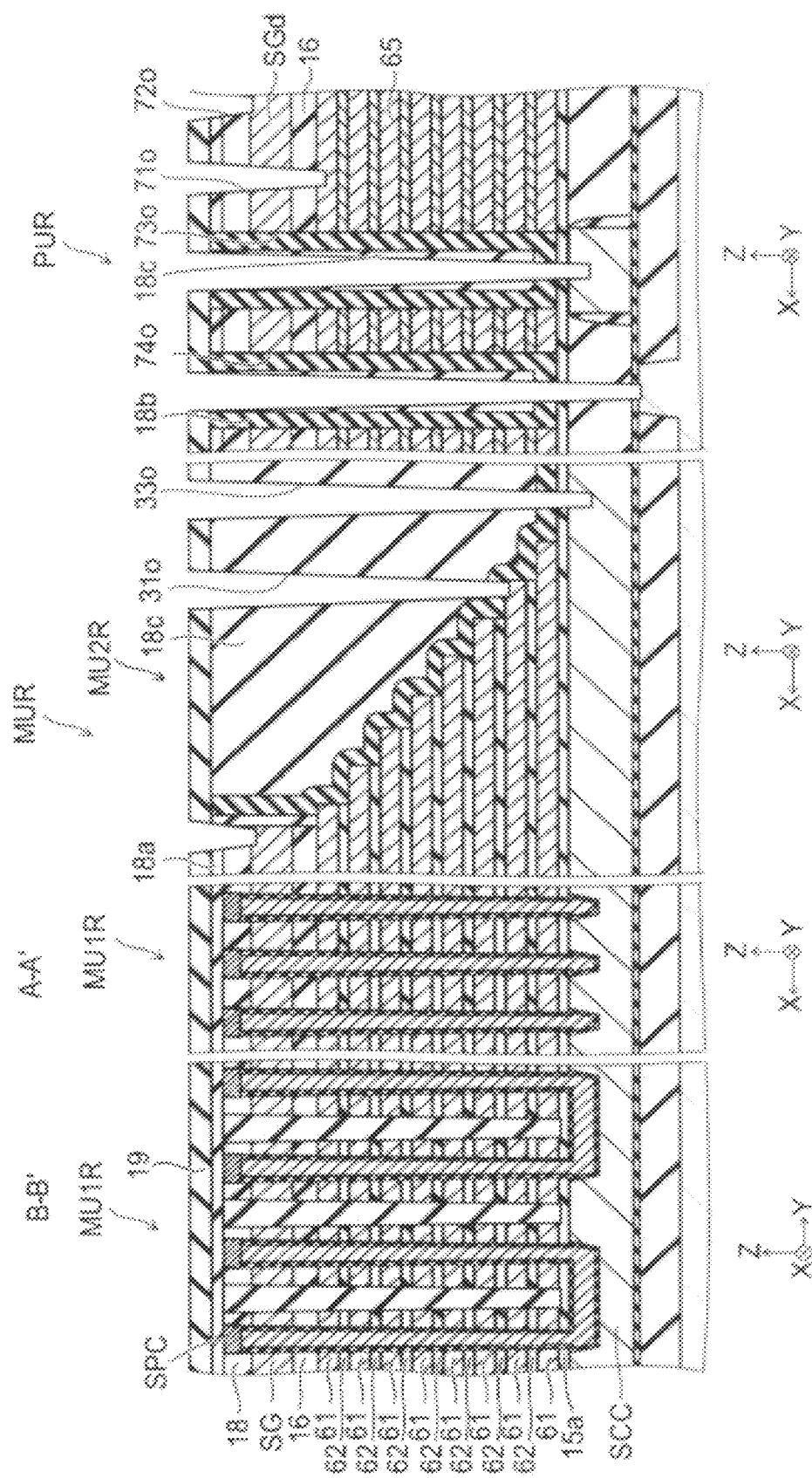

Next, as shown in FIG. 20, a silicon oxide film serving as an interlayer insulating film 19 is formed by e.g. plasma CVD. Then, in the interconnection connecting region MU2R, a contact hole 31o for a memory unit contact electrode 31 connected to the electrode film 61, and a contact hole 33o for a memory unit contact electrode 33 connected to the connecting portion conductive layer SCC are formed. Furthermore, in the non-memory region PUR, an opening 71o for a first non-memory unit contact electrode 71p connected to the dummy conductive film 65, and an opening 72o for a second non-memory unit contact electrode 72p connected to the dummy select gate electrode SGd are formed.

Figure 21:
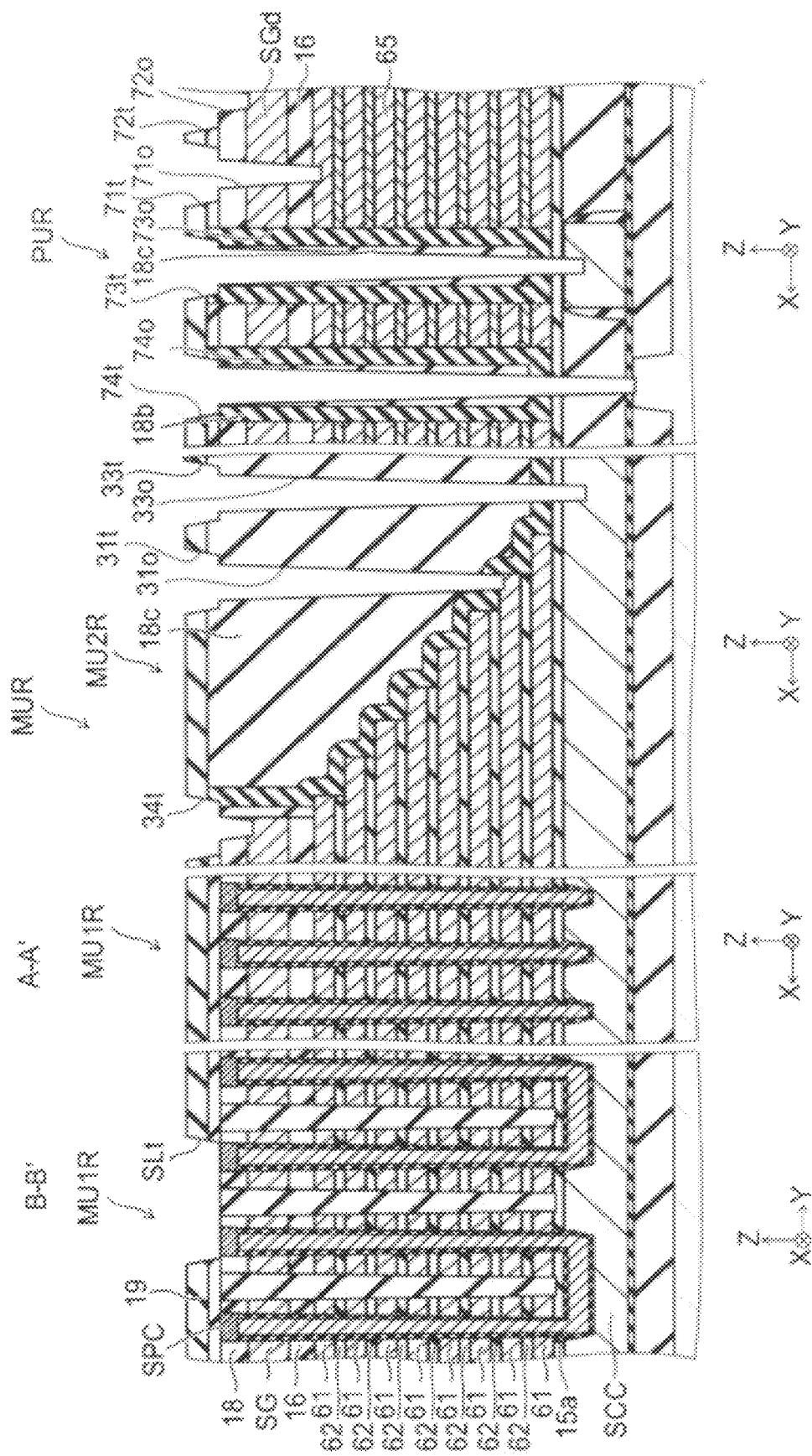

Next, as shown in FIG. 21, a trench SLt is formed in the portion of the interlayer insulating film 19 and the interlayer insulating film 18a intended for a source line SL. A trench 34t is formed in the portion of the interlayer insulating film 19 and the interlayer insulating film 18a intended for a memory unit contact interconnection 34 connected to the select gate electrode SG. A trench 31t, trench 33t, trench 71t, trench 72t, trench 73t, and trench 74t are formed in the portions of the interlayer insulating film 19 and the interlayer insulating film 18a intended for connecting portions of a memory unit contact electrode 31, memory unit contact electrode 33, first non-memory unit contact electrode 71p, second non-memory unit contact electrode 72p, contact electrode 73p, and contact electrode 74p, respectively.

Figure 22:
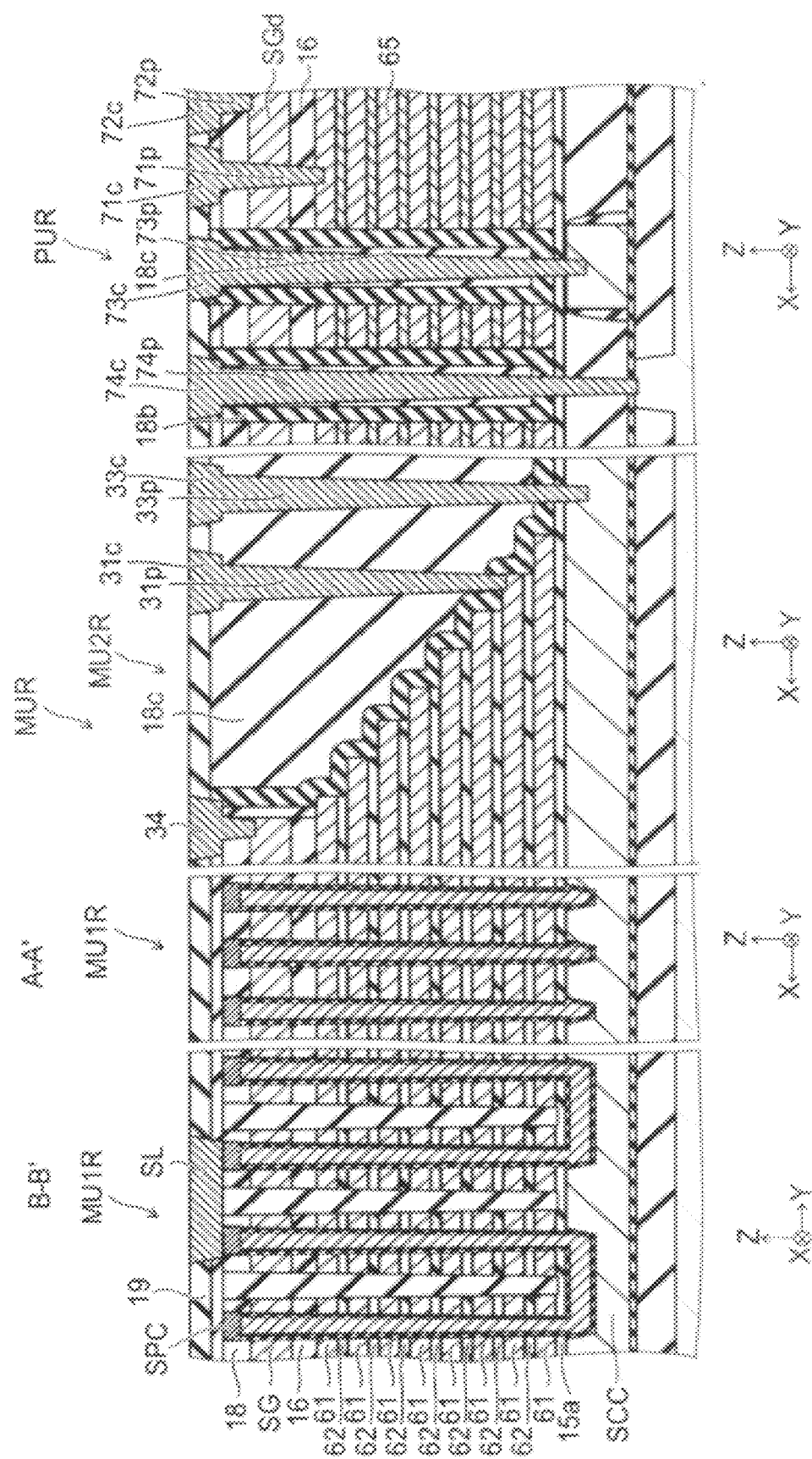

Next, as shown in FIG. 22, a conductive film is buried in the remaining space of the trench SLt, trench 34t, trench 31t, trench 33t, trench 71t, trench 72t, trench 73t, trench 74t, contact hole 31o, contact hole 33o, opening 71o, opening 72o, and opening 73o, and the remaining space of the opening 74o. This conductive film is e.g. a stacked film of Ti film/TiN film/W film. Then, the upper surface of the conductive film is removed by CMP (chemical mechanical polishing). Thus, by a dual damascene process, contact plugs and interconnections are simultaneously formed.

More specifically, the source line SL, the memory unit contact interconnection 34, the connecting portion 31c of the memory unit contact electrode 31, the connecting portion 33c of the memory unit contact electrode 33, the connecting portion 71c of the first non-memory unit contact electrode 71p, the connecting portion 72c of the second non-memory unit contact electrode 72p, the connecting portion 73c of the contact electrode 73p, the connecting portion 74c of the contact electrode 74p, the memory unit contact electrode 31, the memory unit contact electrode 33, the first non-memory unit contact electrode 71p, the second non-memory unit contact electrode 72p, the contact electrode 73p, and the contact electrode 74p are simultaneously formed.

Here, the stopper film 18b and the interlayer insulating film 18c are interposed between the contact electrode 73p on one hand and the dummy conductive film 65 and the dummy select gate electrode SGd on the other. These stopper film 18b and interlayer insulating film 18c constitute an interlayer insulating film 731. Thus, the contact electrode 73p is electrically isolated from the dummy conductive film 65 and the dummy select gate electrode SGd.

Furthermore, the stopper film 18b and the interlayer insulating film 18c are interposed between the contact electrode 74p on one hand and the dummy conductive film 65 and the dummy select gate electrode SGd on the other. These stopper film 18b and interlayer insulating film 18c constitute an interlayer insulating film 741. Thus, the contact electrode 74p is electrically isolated from the dummy conductive film 65 and the dummy select gate electrode SGd.

Thus, the peripheral circuit contact interlayer insulating film (interlayer insulating film 731) can include a stacked film of a silicon nitride film and a silicon oxide film. Thus, high insulation performance can be achieved between the contact electrode 73p on one hand and the dummy conductive film 65 and the dummy select gate electrode SGd on the other. The peripheral circuit substrate contact interlayer insulating film (interlayer insulating film 741) can include a stacked film of a silicon nitride film and a silicon oxide film. Thus, high insulation performance can be achieved between the contact electrode 74p on one hand and the dummy conductive film 65 and the dummy select gate electrode SGd on the other.

Figure 23:
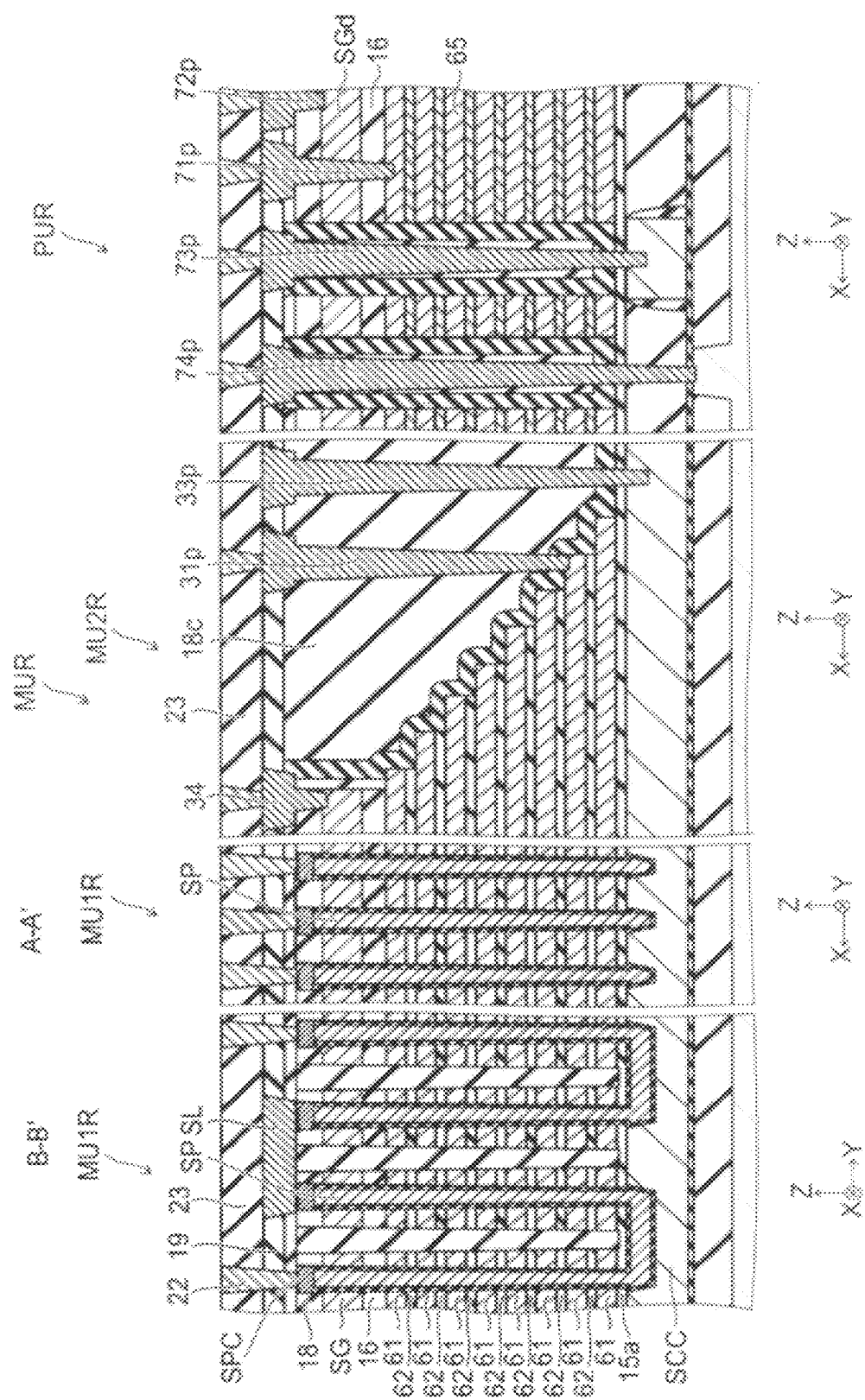

Next, as shown in FIG. 23, an interlayer insulating film 23 is formed. An opening is formed therein by lithography and RIE. A conductive film is buried inside the opening. This conductive film can be e.g. a stacked film of TiN film/TiN film/W film. Then, the upper portion of the conductive film is removed by CMP. Thus, the connecting portion to the conductive layer at the level of the source line SL is formed. Simultaneously, a contact plug (part of the contact electrodes VA1 and VA2) is formed in the upper portion of the semiconductor pillar SP connected to the bit line BL (such as the first semiconductor pillar SP1 and the fourth semiconductor pillar SP4).

Figure 24:
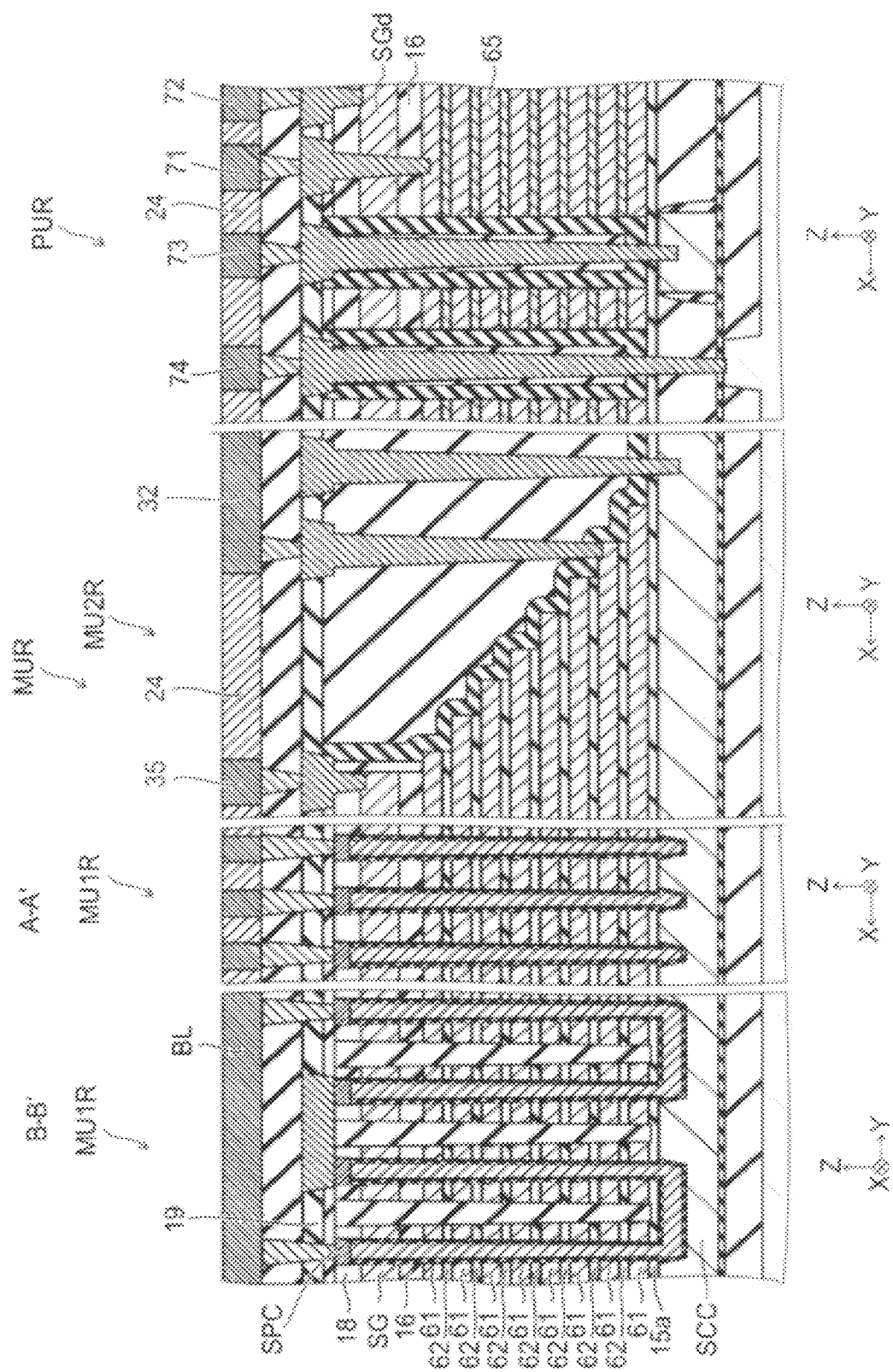

Next, as shown in FIG. 24, an interlayer insulating film 24 is formed. A trench is formed in its portion corresponding to the bit line BL by lithography and RIE. Then, a conductive film is buried inside the trench. This conductive film is e.g. a stacked film of Ta film/TaN film/Cu film. Then, the upper portion of this conductive film is removed by CMP. Thus, a bit line BL and interconnections in the same layer as the bit line BL (word interconnection 32, interconnection 35, interconnection 71, interconnection 72, interconnection 73, and interconnection 74) are formed.

Figure 25:
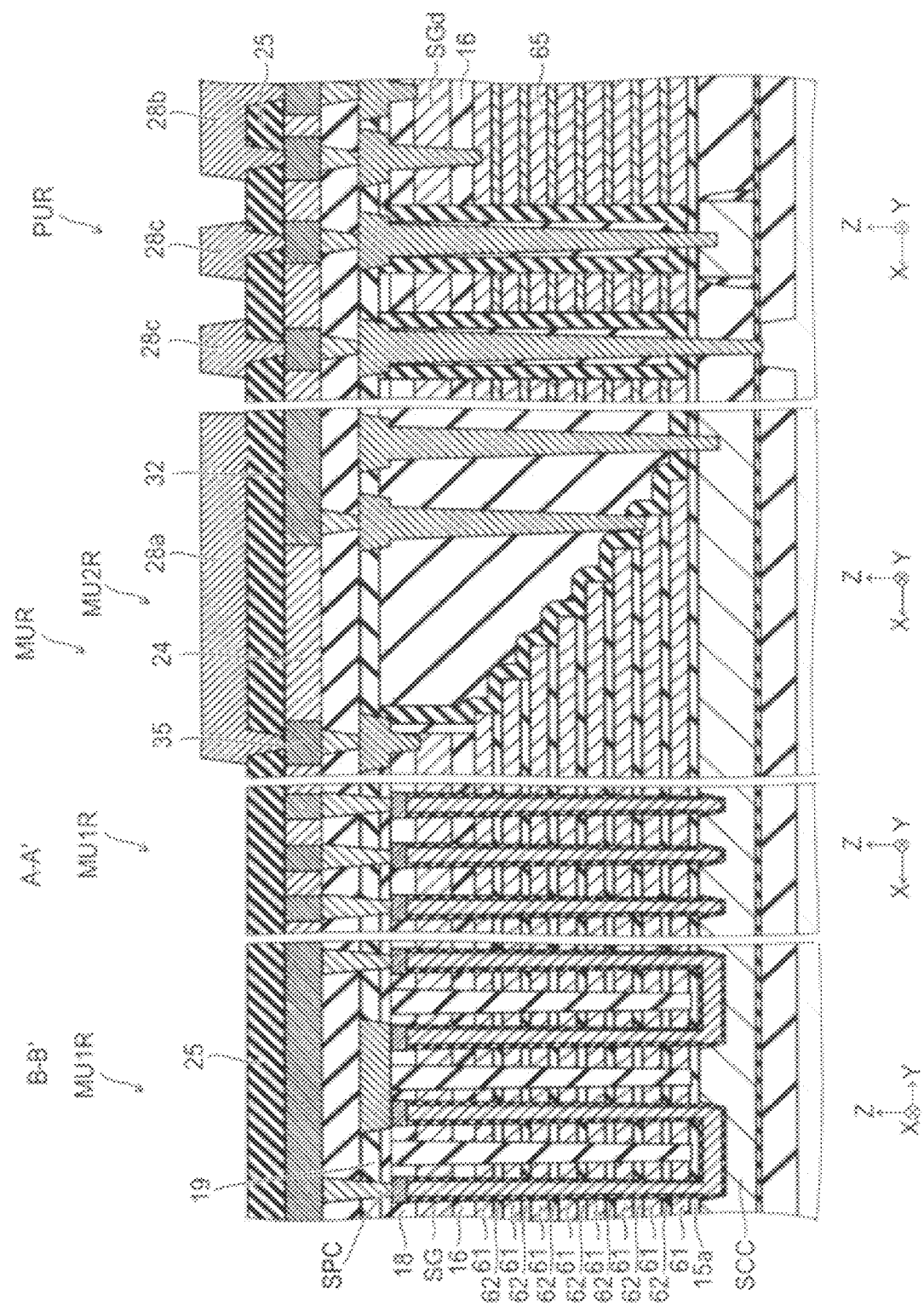

Next, as shown in FIG. 25, an interlayer insulating film 25 is formed. An opening for a contact plug to the interconnection at the level of the interlayer insulating film 25 is formed. A conductive film is buried in this opening. This conductive film is e.g. a stacked film of Ti film/TiN film/AlCu film. Then, this stacked film is processed into a prescribed shape. Thus, a metal interconnection 28a, metal interconnection 28b, metal interconnection 28c, and metal interconnection 28d are formed. Furthermore, interconnect layers and bonding pads, not shown, are formed.

Further thereon, an interlayer insulating film 27 (e.g., silicon oxide film) and a passivation film 29 (e.g., silicon nitride film) for device protection are formed. Furthermore, an opening is formed in the portion of these films corresponding to the bonding pad.

By the foregoing process, the nonvolatile semiconductor memory device 110 is manufactured.

Figure 26:
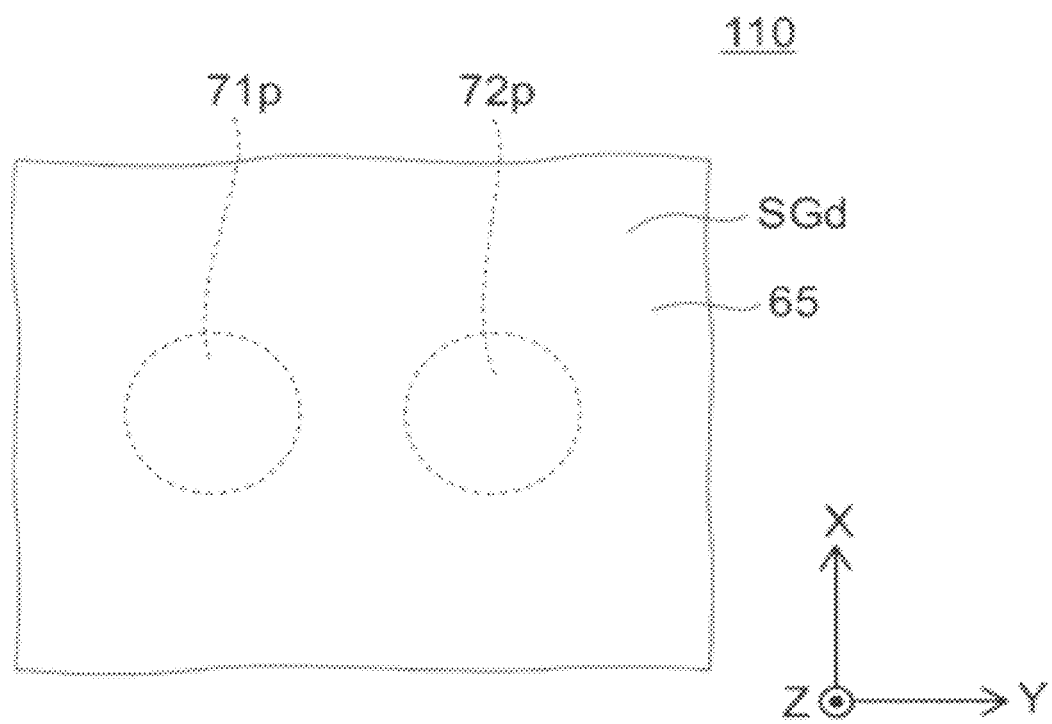
FIG. 26 is a schematic plan view illustrating the configuration of the nonvolatile semiconductor memory device according to the first embodiment.

FIG. 26 is a schematic plan view illustrating the configuration of the nonvolatile semiconductor memory device according to the first embodiment.

More specifically, this figure illustrates the layout of the first non-memory unit contact electrode 71p and the second non-memory unit contact electrode 72p in the nonvolatile semiconductor memory device 110. This figure is a plan view of the first non-memory unit contact electrode 71p and the second non-memory unit contact electrode 72p as viewed along the Z-axis direction.

As shown in FIG. 26, in the nonvolatile semiconductor memory device 110, the first non-memory unit contact electrode 71p connected to the dummy conductive film 65 and the second non-memory unit contact electrode 72p connected to the dummy select gate electrode SGd are not continuous with, but independent of each other. That is, as viewed along the Z-axis direction, the first non-memory unit contact electrode 71p does not include any portion overlapping the second non-memory unit contact electrode 72p.

However, the embodiment is not limited thereto. The layout of the first non-memory unit contact electrode 71p and the second non-memory unit contact electrode 72p is arbitrary.

Figure 27:
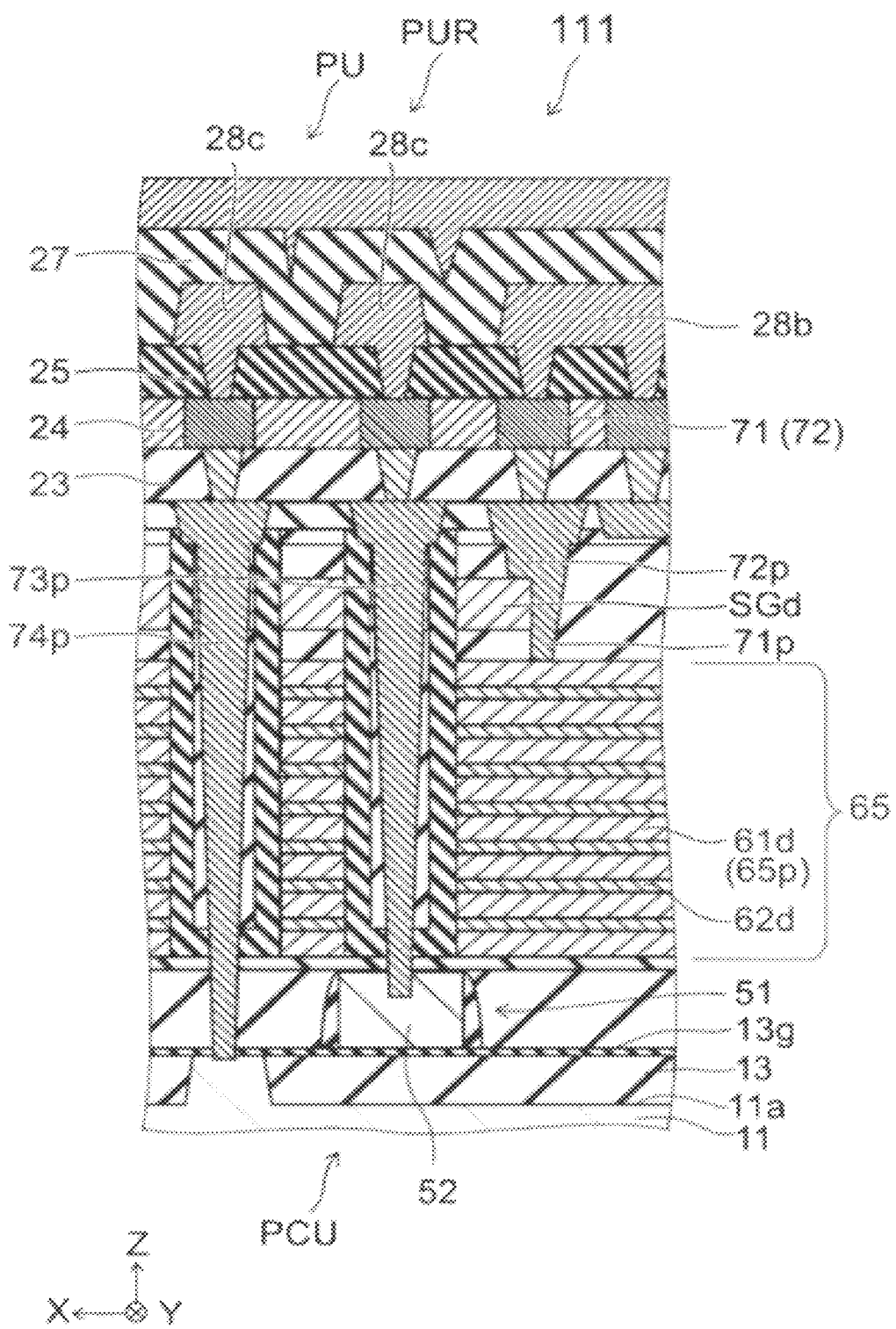
FIG. 27 is a schematic cross-sectional view illustrating the configuration of another nonvolatile semiconductor memory device according to the first embodiment.

FIG. 27 is a schematic cross-sectional view illustrating the configuration of an alternative nonvolatile semiconductor memory device according to the first embodiment.

More specifically, this figure illustrates the configuration of the non-memory unit PU in the alternative nonvolatile semiconductor memory device 111 according to this embodiment.

Figure 28:
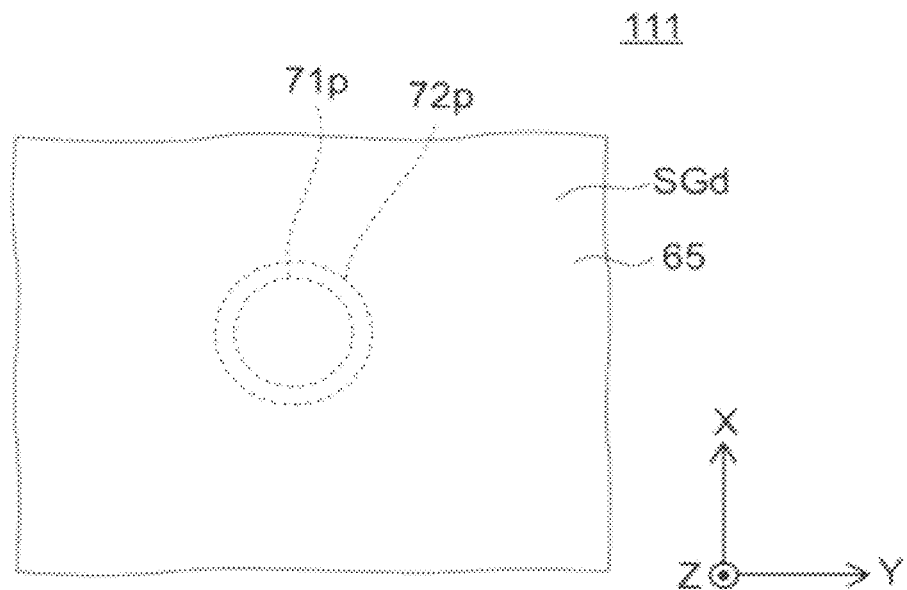
FIG. 28 is a schematic plan view illustrating the configuration of the another nonvolatile semiconductor memory device according to the first embodiment.

FIG. 28 is a schematic plan view illustrating the configuration of the alternative nonvolatile semiconductor memory device according to the first embodiment.

More specifically, this figure illustrates the layout (as viewed along the Z-axis direction) of the first non-memory unit contact electrode 71p and the second non-memory unit contact electrode 72p in the nonvolatile semiconductor memory device 111.

The configuration of the memory unit MU in the nonvolatile semiconductor memory device 111 can be made similar to the configuration of the memory unit MU in the nonvolatile semiconductor memory device 110, and hence the description thereof is omitted.

As illustrated in FIGS. 27 and 28, in the nonvolatile semiconductor memory device 111, the position in the X-Y plane of the first non-memory unit contact electrode 71p is substantially the same as the position of the second non-memory unit contact electrode 72p. That is, the first non-memory unit contact electrode 71p and the second non-memory unit contact electrode 72p are electrically connected. Thus, advantageously, the potential of the first non-memory unit contact electrode 71p and the potential of the second non-memory unit contact electrode 72p can be established with a small area.

In this example, the outer periphery in the X-Y plane of the second non-memory unit contact electrode 72p encloses the outer periphery in the X-Y plane of the first non-memory unit contact electrode 71p. By such configuration, the process steps can be decreased, and the chip area can be reduced. Here, alternatively, the outer periphery in the X-Y plane of the first non-memory unit contact electrode 71p may enclose the outer periphery in the X-Y plane of the second non-memory unit contact electrode 72p.

Figure 29:
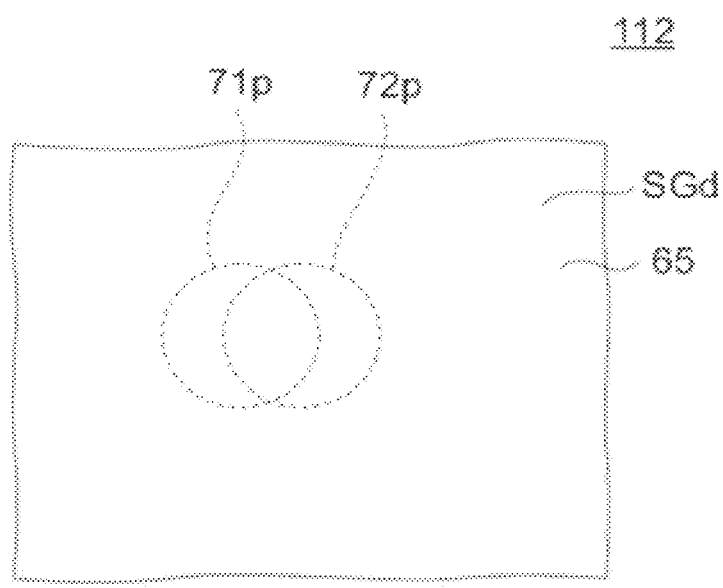
FIG. 29 is a schematic plan view illustrating the configuration of the another nonvolatile semiconductor memory device according to the first embodiment.

FIG. 29 is a schematic plan view illustrating the configuration of an alternative nonvolatile semiconductor memory device according to the first embodiment.

More specifically, this figure illustrates the configuration of the non-memory unit PU in the alternative nonvolatile semiconductor memory device 112 according to this embodiment. The configuration of the memory unit MU in the nonvolatile semiconductor memory device 112 can be made similar to the configuration of the memory unit MU in the nonvolatile semiconductor memory device 110, and hence the description thereof is omitted.

As illustrated in FIG. 29, also in the nonvolatile semiconductor memory device 112, the first non-memory unit contact electrode 71p and the second non-memory unit contact electrode 72p are continuous with, and electrically connected to each other.

In this example, the outer periphery in the X-Y plane of the second non-memory unit contact electrode 72p and the outer periphery in the X-Y plane of the first non-memory unit contact electrode 71p overlap each other.

As in the nonvolatile semiconductor memory devices 111 and 112, as viewed along the Z-axis direction, the first non-memory unit contact electrode 71p can include a portion overlapping the second non-memory unit contact electrode 72p. By such configuration, the chip area can be reduced.

Second Embodiment

Figure 30:
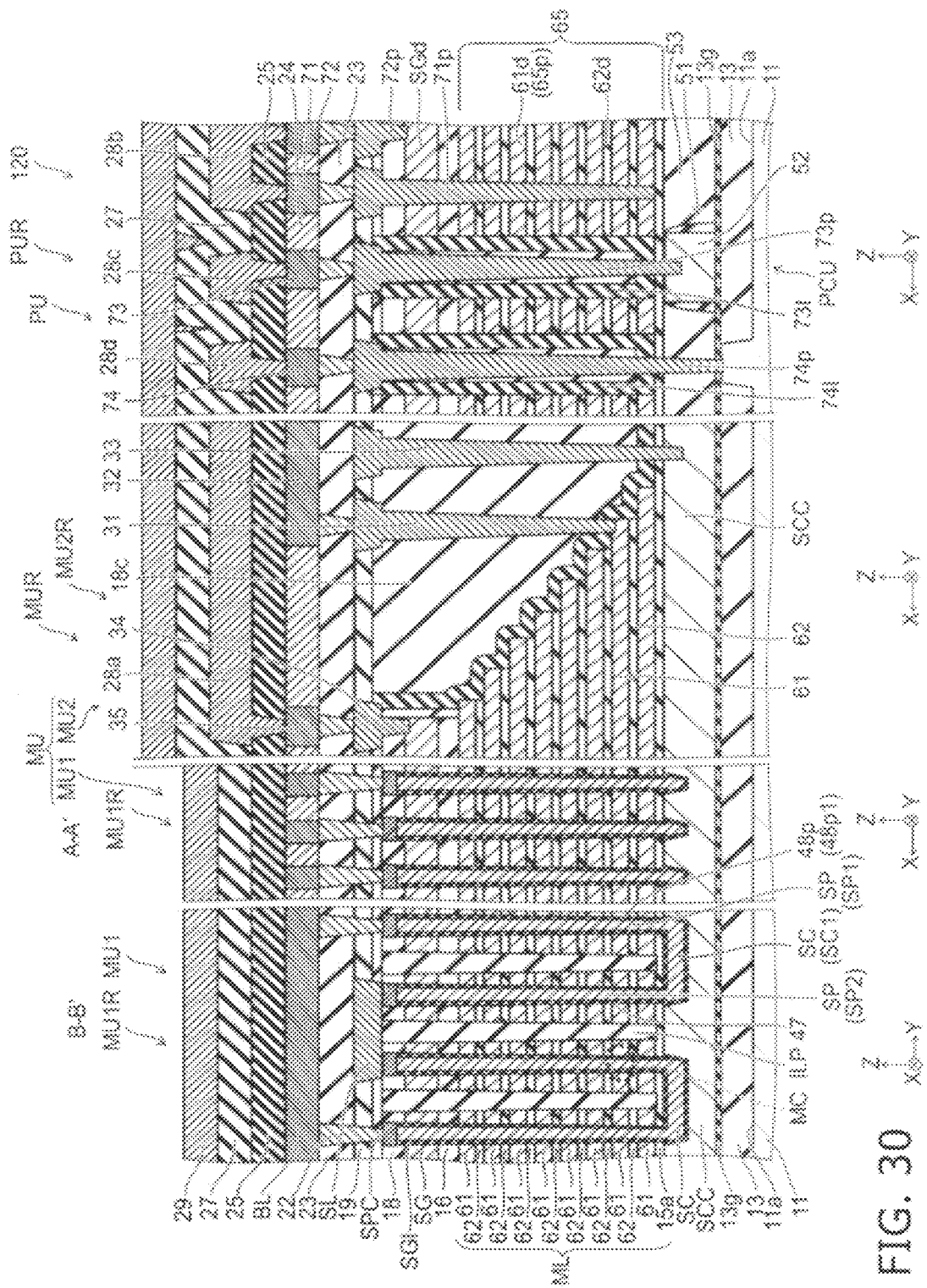
FIG. 30 is a schematic cross-sectional view illustrating the configuration of a nonvolatile semiconductor memory device according to a second embodiment.

FIG. 30 is a schematic cross-sectional view illustrating the configuration of a nonvolatile semiconductor memory device according to a second embodiment.

As shown in FIG. 30, the nonvolatile semiconductor memory device 120 according to this embodiment also includes a memory unit MU and a non-memory unit PU. The configuration of the memory unit MU can be made similar to that in the nonvolatile semiconductor memory device 110, for instance, and hence the description thereof is omitted.

As shown in FIG. 30, the nonvolatile semiconductor memory device 120 is different from the nonvolatile semiconductor memory device 110 in the configuration of the dummy conductive film 65 in the non-memory unit PU.

More specifically, also in the nonvolatile semiconductor memory device 120, the dummy conductive film 65 includes a plurality of first dummy films 61d respectively in the same layer as the plurality of electrode films 61, and a plurality of second dummy films 62d respectively in the same layer as the plurality of interelectrode insulating films 62. However, in this example, the second dummy film 62d is an insulating film.

That is, the second dummy film 62d is made of the same material as the interelectrode insulating film 62, for instance. Furthermore, the first dummy film 61d is made of the same material as the electrode film 61, for instance.

Also in this case, the first dummy film 61d included in the dummy conductive film 65 constitutes a portion 65p of the dummy conductive film 65 in the same layer as at least one of the plurality of electrode films 61.

Here, as illustrated in FIG. 30, the first non-memory unit contact electrode 71p reaches the lowermost first dummy film 61d.

Also in the nonvolatile semiconductor memory device 120 thus configured, the dummy conductive film 65 and the dummy select gate electrode SGd of the non-memory unit PU are placed at a prescribed potential. Thus, electrical interference between nodes with different potentials is suppressed, and stable operation can be achieved.

Furthermore, also in the nonvolatile semiconductor memory device 120, as viewed along the Z-axis direction, the first non-memory unit contact electrode 71p can include, or not include, a portion overlapping the second non-memory unit contact electrode 72p.

Third Embodiment

Figure 31:
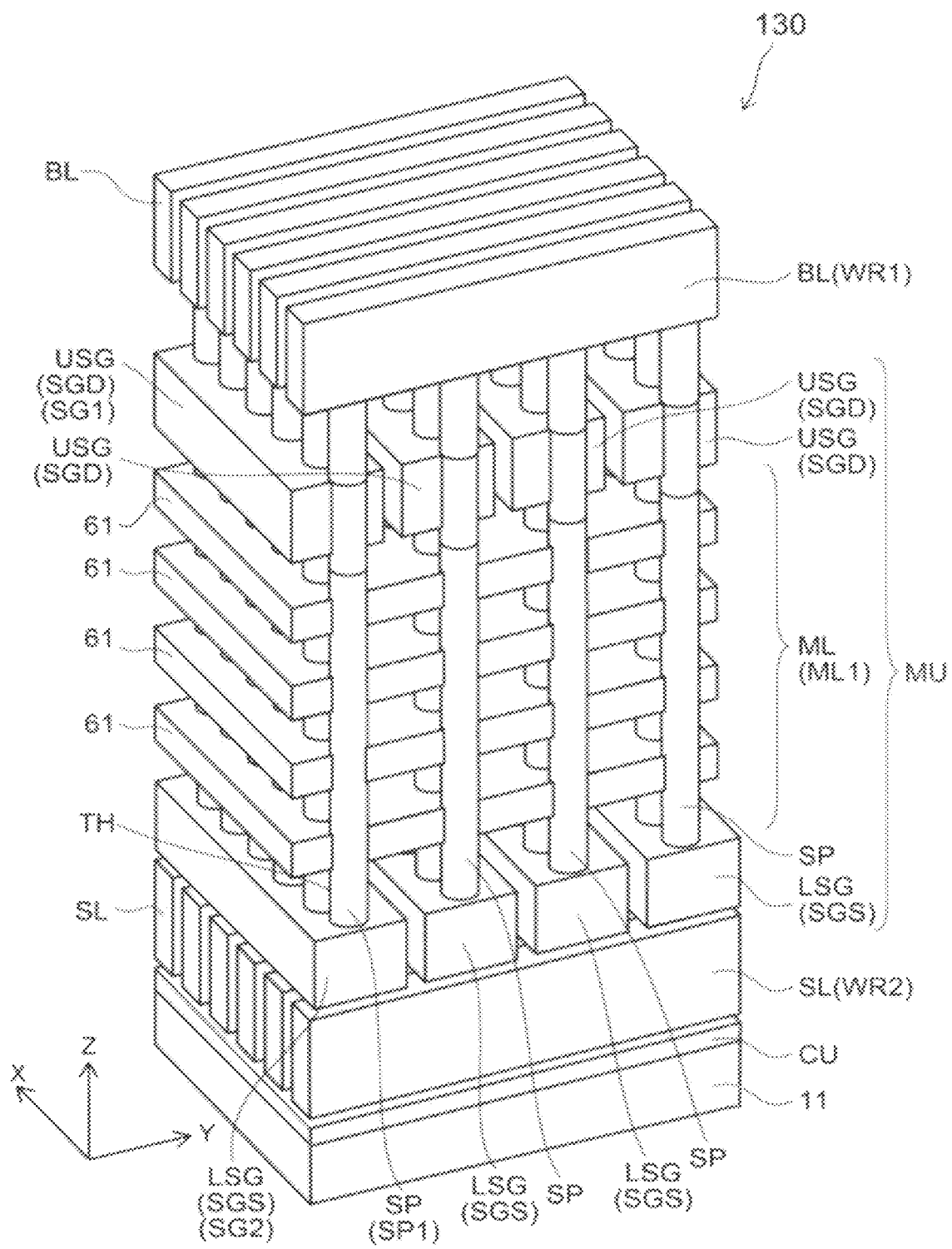
FIG. 31 is a schematic perspective view illustrating the configuration of a nonvolatile semiconductor memory device according to a third embodiment.

FIG. 31 is a schematic perspective view illustrating the configuration of a nonvolatile semiconductor memory device according to a third embodiment.

In FIG. 31, for clarity of illustration, only the conductive portions are shown, and illustration of the insulating portions is omitted.

More specifically, FIG. 31 illustrates a matrix memory cell unit MU1 in the nonvolatile semiconductor memory device 130 according to this embodiment.

The configuration of the non-memory unit PU, and the interconnection connecting unit MU2 of the memory unit MU in the nonvolatile semiconductor memory device 130 can be made similar to those in the nonvolatile semiconductor memory devices 110, 111, 112, and 120, and hence the description thereof is omitted.

As shown in FIG. 31, in the nonvolatile semiconductor memory device 130 according to this embodiment, the semiconductor connecting portion SC is not provided, but the semiconductor pillars SP are independent of each other. That is, the nonvolatile semiconductor memory device 130 includes linear NAND strings.

The memory unit MU (matrix memory cell unit MU1) in the nonvolatile semiconductor memory device 130 includes a stacked structure ML (first stacked structure ML1), a select gate electrode SG (first select gate electrode SG1), a semiconductor pillar SP (first semiconductor pillar SP1), a memory layer 48 (first pillar portion memory layer 48p1), an outer insulating film 43 (first pillar portion outer insulating film 43p1), and an inner insulating film 42 (first pillar portion inner insulating film 42p1). The configuration of the stacked structure ML, semiconductor pillar SP, memory layer 48, outer insulating film 43, and inner insulating film 42 can be made similar to those in the first embodiment, and hence the description thereof is omitted.

In the memory unit MU of the nonvolatile semiconductor memory device 130, an upper select gate electrode USG (first select gate electrode SG1, serving as e.g. a drain side select gate electrode SGD) is provided above the stacked structure ML. A lower select gate electrode LSG (second select gate electrode SG2, serving as e.g. a source side select gate electrode SGS) is provided below the stacked structure ML.

An upper select gate insulating film USGI is provided between the upper select gate electrode USG and the semiconductor pillar SP. A lower select gate insulating film LSGI is provided between the lower select gate electrode LSG and the semiconductor pillar SP.

The select gate insulating film SGI (upper select gate insulating film USGI and lower select gate insulating film LSGI) may be the stacked film of the inner insulating film 42, the memory layer 48, and the outer insulating film 43. Alternatively, the select gate insulating film SGI may be an insulating film different from the stacked film of the inner insulating film 42, the memory layer 48, and the outer insulating film 43. The select gate insulating film SGI may be either a single layer film or a stacked film.

A source line SL (e.g., second interconnection WR2) is provided below the lower select gate electrode LSG. An interlayer insulating film (not shown) is provided below the source line SL. An interlayer insulating film (not shown) is provided between the source line SL and the lower select gate electrode LSG.

The semiconductor pillar SP is connected to the source line SL below the lower select gate electrode LSG, and to a bit line BL (e.g., first interconnection WR1) above the upper select gate electrode USG. Thus, memory cells MC are formed in the stacked structure ML between the upper select gate electrode USG and the lower select gate electrode LSG. The semiconductor pillar SP functions as one linear memory string.

The upper select gate electrode USG is divided in the Y-axis direction by an interlayer insulating film (not shown) and shaped like strips extending along the X-axis direction. The lower select gate electrode LSG is divided in the Y-axis direction by an interlayer insulating film (not shown) and shaped like strips extending along the X-axis direction.

On the other hand, the bit line BL connected to the upper portion of the semiconductor pillar SP and the source line SL connected to the lower portion of the semiconductor pillar SP are shaped like strips extending in the Y-axis direction.

In this example, the electrode film 61 is a plate-like conductive film parallel to the X-Y plane.

Also in the nonvolatile semiconductor memory device 130 thus configured, the dummy conductive film 65 and the dummy select gate electrode SGd of the non-memory unit PU are placed at a prescribed potential. Thus, electrical interference between nodes with different potentials is suppressed, and stable operation can be achieved.

Furthermore, also in the nonvolatile semiconductor memory device 130, as viewed along the Z-axis direction, the first non-memory unit contact electrode 71p can include, or not include, a portion overlapping the second non-memory unit contact electrode 72p.

As described above, the embodiments provide a nonvolatile semiconductor memory device of the collectively processed three-dimensional stacked type achieving more stable operation.

In the foregoing description, the memory layer 48 is illustratively made of silicon nitride. However, the embodiments are not limited thereto. The memory layer 48 can be a single layer film made of a material selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality of materials selected from the group.

Furthermore, the interelectrode insulating film 62, the inner insulating film 42, and the outer insulating film 43 can be a single layer film made of a material selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality of materials selected from the group.

In this specification, "perpendicular" and "parallel" mean not only being exactly perpendicular and exactly parallel, but include, for instance, variations in the manufacturing process, and only need to mean substantially perpendicular and substantially parallel.

The embodiments of the invention have been described with reference to examples. However, the invention is not limited to these examples. For instance, various specific configurations of the components such as the electrode film, interelectrode insulating film, select gate electrode, semiconductor pillar, semiconductor connecting portion, connecting portion conductive film, memory layer, inner insulating film, outer insulating film, insulating film, conductive film, interlayer insulating film, source line, bit line, interconnection, dummy conductive film, dummy electrode, and contact electrode included in the nonvolatile semiconductor memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the nonvolatile semiconductor memory device described above in the embodiments of the invention. All the nonvolatile semiconductor memory devices thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device comprising:
    a memory unit configured to store information; and
    a non-memory unit juxtaposed with the memory unit and not configured to store information,
    the memory unit including:
        a first stacked structure including a plurality of first electrode films stacked in a first direction, and a first interelectrode insulating film provided between the plurality of first electrode films;
        a first select gate electrode stacked with the first stacked structure along the first direction;
        a first semiconductor pillar piercing the first stacked structure and the first select gate electrode along the first direction; and
        a first pillar portion memory layer provided between the plurality of first electrode films and the first semiconductor pillar, and
    the non-memory unit including:
        a dummy conductive film including a portion being in a layer identical to at least one of the plurality of first electrode films;
        a dummy select gate electrode being in a layer identical to the select gate electrode;
        a first non-memory unit contact electrode electrically connected to the dummy conductive film and extending along the first direction; and
        a second non-memory unit contact electrode electrically connected to the dummy select gate electrode and extending along the first direction.

2. The device according to claim 1, wherein the dummy conductive film includes:
    a plurality of first dummy films, each of the plurality of first dummy films being in a layer identical to each of the plurality of first electrode films; and
    a second dummy film being in a layer identical to the first interelectrode insulating film.

3. The device according to claim 2, wherein the plurality of first dummy films are conductive, and the second dummy film is conductive.

4. The device according to claim 2, wherein a material used for each of the plurality of first dummy films is identical to a material used for each of the plurality of electrode films.

5. The device according to claim 2, wherein the plurality of first dummy films are conductive, and the second dummy film is insulative.

6. The device according to claim 2, wherein a material used for the second dummy film is identical to a material used for the interelectrode insulating film.

7. The device according to claim 2, further comprising:
    a substrate, the memory unit and the non-memory unit being provided on the substrate,
    the first non-memory unit contact electrode reaching the second dummy film nearest to the substrate.

8. The device according to claim 1, wherein a width of the dummy conductive film is identical to a width along the first direction of the first stacked structure.

9. The device according to claim 1, wherein the first non-memory unit contact electrode and the second non-memory unit contact electrode are electrically connected.

10. The device according to claim 1, wherein the first non-memory unit contact electrode includes a portion overlapping the second non-memory unit contact electrode as viewed along the first direction.

11. The device according to claim 1, further comprising:
    a substrate, the memory unit and the non-memory unit being provided on the substrate,
    the non-memory unit further including a peripheral circuit unit including a peripheral circuit transistor provided between the substrate and the dummy conductive film, and
    a potential of the first non-memory unit contact electrode and a potential of the second non-memory unit contact electrode are equal to or higher than a minimum of an application voltage applied to the peripheral circuit transistor, and equal to or lower than a maximum of the application voltage.

12. The device according to claim 1, further comprising:
    a substrate, the memory unit and the non-memory unit being provided on the substrate,
    the non-memory unit further including a peripheral circuit unit including a peripheral circuit transistor provided between the substrate and the dummy conductive film, and
    a potential of the first non-memory unit contact electrode and a potential of the second non-memory unit contact electrode are an intermediate potential between a minimum of an application voltage applied to the peripheral circuit transistor and a maximum of the application voltage.

13. The device according to claim 1, further comprising:
    a substrate, the memory unit and the non-memory unit being provided on the substrate, the non-memory unit further including a peripheral circuit unit including a peripheral circuit transistor provided between the substrate and the dummy conductive film, and the first non-memory unit contact electrode and the second non-memory unit contact electrode being placed at a potential lower than a potential of the substrate.

14. The device according to claim 1, further comprising:

a substrate, the memory unit and the non-memory unit being provided on the substrate, the non-memory unit further including a peripheral circuit unit including a peripheral circuit transistor provided between the substrate and the dummy conductive film, and the non-memory unit further including:
- a peripheral circuit contact electrode electrically connected to a gate electrode of the peripheral circuit transistor and extending along the first direction; and
- a peripheral circuit contact interlayer insulating film provided between the peripheral circuit contact electrode and the dummy conductive film, and between the peripheral circuit contact electrode and the dummy select gate electrode.

15. The device according to claim 14, wherein the peripheral circuit contact interlayer insulating film includes a stacked film of a silicon nitride film and a silicon oxide film.

16. The device according to claim 1, wherein the memory unit further includes:
- a first pillar portion outer insulating film provided between the first pillar portion memory layer and the plurality of first electrode films; and
- a first pillar portion inner insulating film provided between the first pillar portion memory layer and the first semiconductor pillar.

17. The device according to claim 1, wherein the memory unit further includes:

a second stacked structure adjacent to the first stacked structure in a second direction perpendicular to the first direction, the second stacked structure including a plurality of second electrode films stacked in the first direction, and a second interelectrode insulating film provided between the plurality of second electrode films;

a second select gate electrode stacked with the second stacked structure along the first direction;

a second semiconductor pillar piercing the second stacked structure and the second select gate electrode along the first direction;

a second pillar portion memory layer provided between the plurality of second electrode films and the second semiconductor pillar; and a semiconductor connecting portion connecting one end of the first semiconductor pillar and one end of the second semiconductor pillar.

18. The device according to claim 17, wherein the memory unit further includes:
- a second pillar portion outer insulating film provided between the second pillar portion memory layer and the plurality of second electrode films; and
- a second pillar portion inner insulating film provided between the second pillar portion memory layer and the second semiconductor pillar.

19. The device according to claim 17, wherein the plurality of first electrode films and the plurality of second electrode films extend along a third direction perpendicular to the first direction and the second direction.

20. The device according to claim 17, wherein the first select gate electrode and the second select gate electrode extend along a third direction perpendicular to the first direction and the second direction.

* * * * *